US006646288B2

(12) United States Patent
Yamazaki et al.

(10) Patent No.: US 6,646,288 B2
(45) Date of Patent: Nov. 11, 2003

(54) ELECTRO-OPTICAL DEVICE AND ELECTRONIC EQUIPMENT

(75) Inventors: Shunpei Yamazaki, Atsugi (JP); Hidehito Kitakado, Atsugi (JP); Takeshi Fukunaga, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/263,709

(22) Filed: Oct. 4, 2002

(65) Prior Publication Data

US 2003/0052336 A1 Mar. 20, 2003

Related U.S. Application Data

(62) Division of application No. 09/547,736, filed on Apr. 11, 2000, now Pat. No. 6,498,369.

(30) Foreign Application Priority Data

Apr. 15, 1999 (JP) ............................. 11-108667

(51) Int. Cl.[7] ............................................ H01L 29/04
(52) U.S. Cl. ................................. 257/72; 438/151
(58) Field of Search ........................ 438/151, 156–157, 438/160–161, 166, 486–487; 257/47, 59, 66, 69, 72, 78, 350

(56) References Cited

U.S. PATENT DOCUMENTS

| 4,766,088 A | 8/1988 | Kono et al. |
| 4,774,556 A | 9/1988 | Fujii et al. |
| 4,780,424 A | 10/1988 | Holler et al. |

(List continued on next page.)

FOREIGN PATENT DOCUMENTS

| JP | 4-0369271 | 12/1992 |
| JP | 5-0102483 | 4/1993 |
| JP | 7-0130652 | 5/1995 |
| JP | 07-321339 | 12/1995 |
| JP | 10-247735 | 9/1998 |
| JP | 10-294280 | 11/1998 |
| JP | 11-097702 | 4/1999 |
| JP | 11-133463 | 5/1999 |
| JP | 11-143379 | 5/1999 |
| JP | 11-191628 | 7/1999 |
| JP | 11-338786 | 12/1999 |
| JP | 11-345767 | 12/1999 |
| JP | 11-354442 | 12/1999 |

OTHER PUBLICATIONS

Furue et al., "Characteristics and Driving Scheme of Polymer–Stabilized Monostable FLCD Exhibiting Fast Response Time and High Contrast Ratio with Gray–Scale Capability," SID 98 Digest, pp. 782–785.

Yoshida et al., "A Full–Color Thresholdless Antiferroelectric LCD Exhibiting Wide Viewing Angle with Fast Response Time," SID 97 Digest, pp. 841–844.

Inui et al., "Thresholdless Antiferroelectricity in Liquid Crystals and its Application to Displays," J. Mater. Chem., 1996, 6(4), pp. 671–673.

Shimokawa et al., "Characterization of High–Efficiency Cast–Si Solar Cell Wafers by MBIC Measurement," Japanese Journal of Applied Physics, vol. 27, No. 5, May, 1988, pp. 751–758.

*Primary Examiner*—David Nelms
*Assistant Examiner*—David Vu
(74) *Attorney, Agent, or Firm*—Robinson Intellectual Property Law Office, P.C.

(57) ABSTRACT

An electro-optical device having high operation performance and high reliability, and electronic equipment which include the electro-optical device, are provided. A TFT structure that is strong against hot carrier injection is realized by placing an LDD region which overlaps a gate electrode in an n-channel TFT forming a driver circuit. Furthermore, a TFT structure having a low off current value is realized by placing LDD regions which do not overlap a gate electrode in a pixel TFT forming a pixel section. In addition, the electro-optical device has a memory section on the same insulator, the memory section having a memory transistor and storing data.

12 Claims, 24 Drawing Sheets

U.S. PATENT DOCUMENTS

| Patent | Date | Inventor | Ref |
|---|---|---|---|
| 4,861,730 A | 8/1989 | Hsia et al. | |
| 4,929,988 A | 5/1990 | Yoshikawa | |
| 4,972,371 A | 11/1990 | Komori et al. | |
| 5,017,977 A | 5/1991 | Richardson | |
| 5,021,848 A | 6/1991 | Chiu | |
| 5,053,842 A | 10/1991 | Kojima | |
| 5,071,782 A | 12/1991 | Mori | |
| 5,078,498 A | 1/1992 | Kadakia et al. | |
| 5,146,426 A | 9/1992 | Mukherjee et al. | |
| 5,202,576 A | 4/1993 | Liu et al. | |
| 5,323,042 A | 6/1994 | Matsumoto | |
| 5,350,937 A | 9/1994 | Yamazaki et al. | |
| 5,440,158 A | 8/1995 | Sung-Mu | |
| 5,594,569 A | 1/1997 | Konuma et al. | |
| 5,633,519 A | 5/1997 | Yamazaki et al. | |
| 5,643,826 A | 7/1997 | Ohtani et al. | |
| 5,714,968 A * | 2/1998 | Ikeda | 345/77 |
| 5,789,762 A | 8/1998 | Koyama et al. | |
| 5,818,083 A | 10/1998 | Ito | |
| 5,847,411 A | 12/1998 | Morii | |
| 5,923,962 A | 7/1999 | Ohtani et al. | |
| 5,925,906 A | 7/1999 | Tanaka | |
| 5,939,731 A | 8/1999 | Yamazaki et al. | |
| 5,965,915 A | 10/1999 | Yamazaki et al. | |
| 6,025,894 A * | 2/2000 | Shirasaki et al. | 349/69 |
| 6,055,034 A | 4/2000 | Zhang et al. | |
| 6,166,414 A | 12/2000 | Miyazaki et al. | |
| 6,172,671 B1 | 1/2001 | Shibuya et al. | |
| 6,198,133 B1 | 3/2001 | Yamazaki et al. | |
| 6,281,552 B1 | 8/2001 | Kawasaki et al. | |
| 6,335,231 B1 * | 1/2002 | Yamazaki et al. | 438/151 |

* cited by examiner

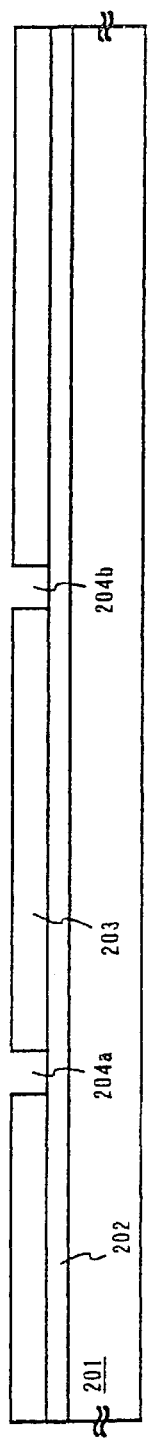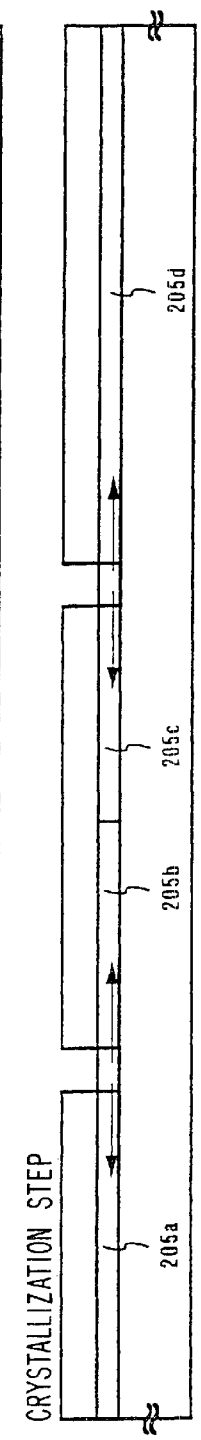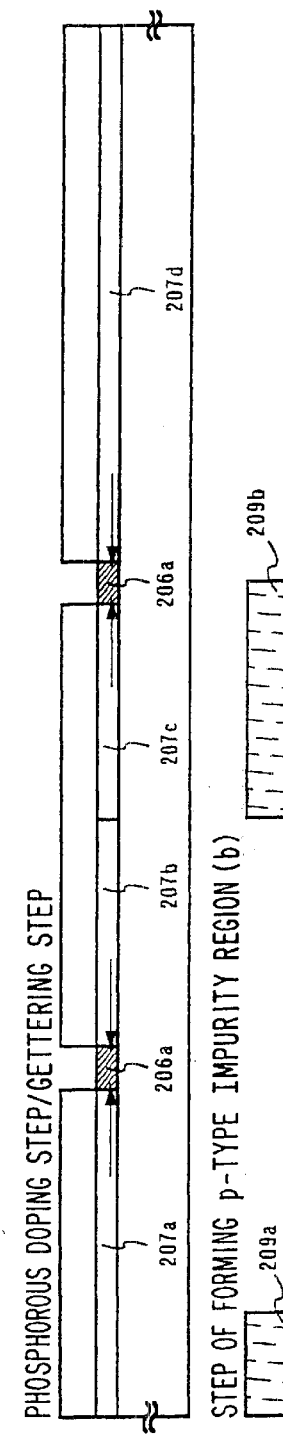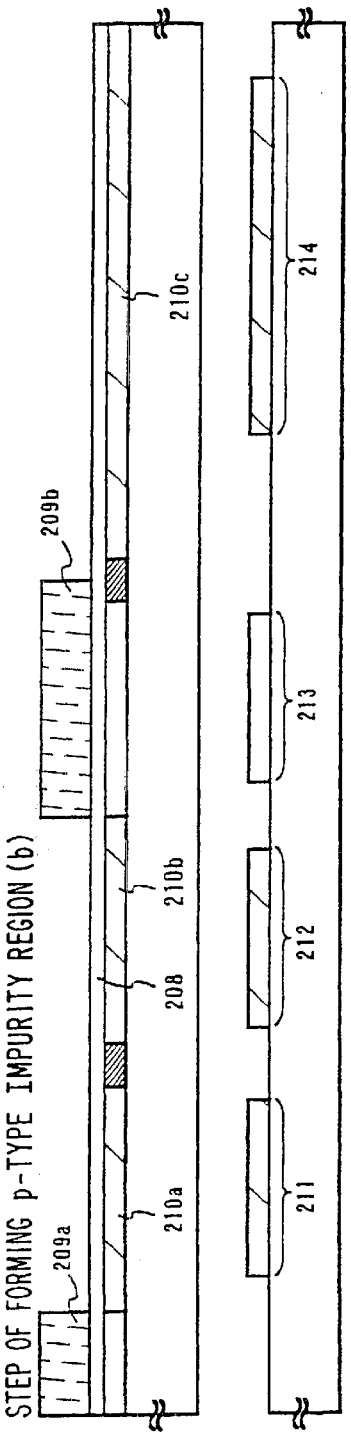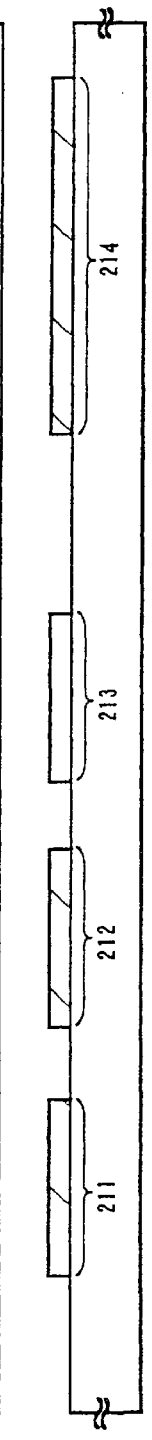

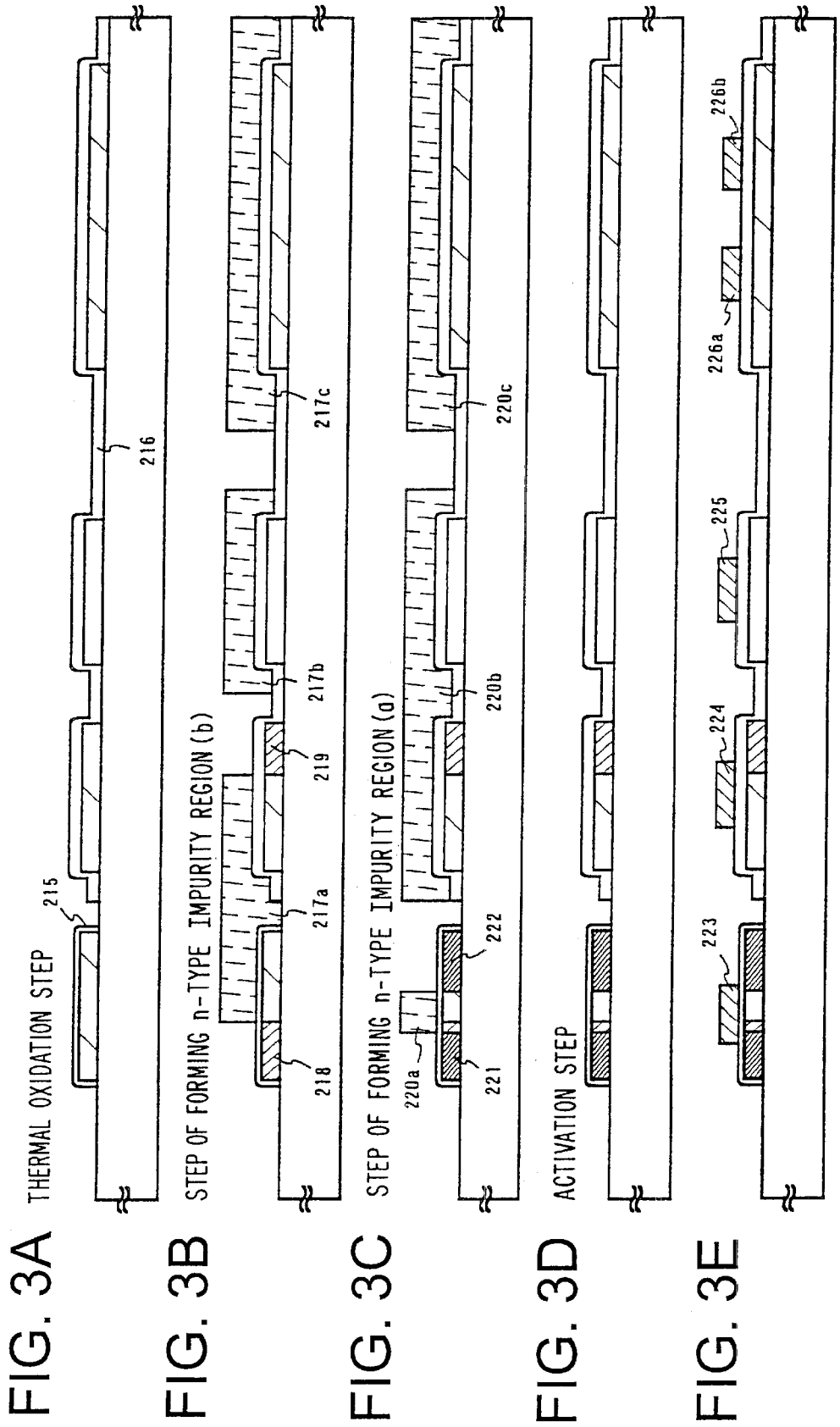

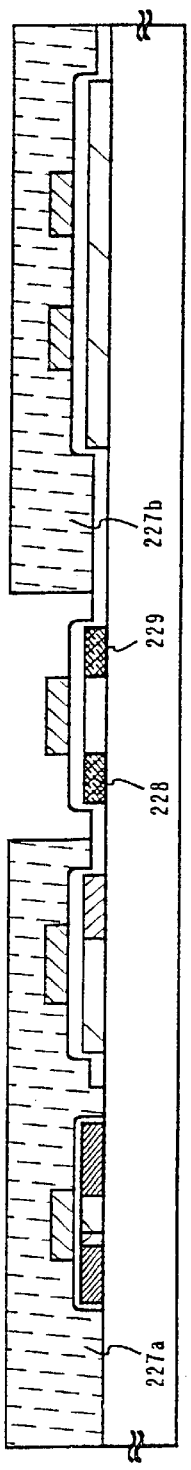
FIG. 4A  STEP OF FORMING p-TYPE IMPURITY REGION (a)
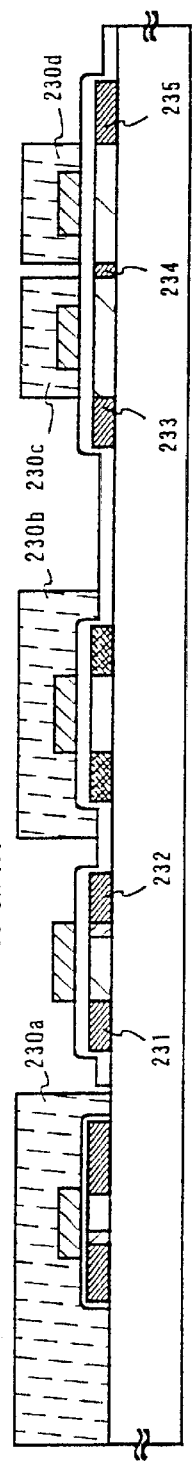
FIG. 4B  STEP OF FORMING n-TYPE IMPURITY REGION (a)
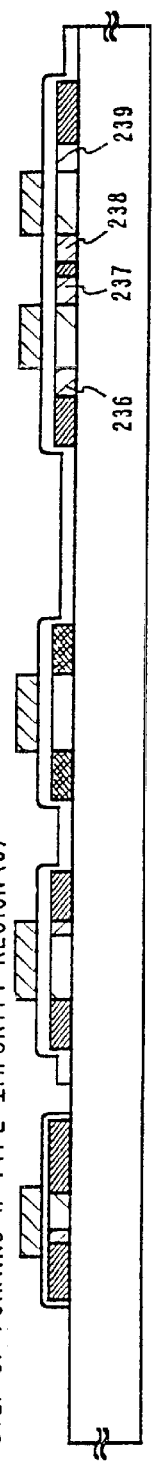
FIG. 4C  STEP OF FORMING n-TYPE IMPURITY REGION (c)
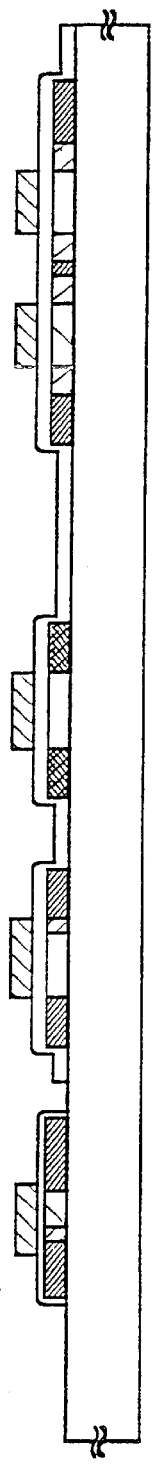
FIG. 4D  ACTIVATION STEP

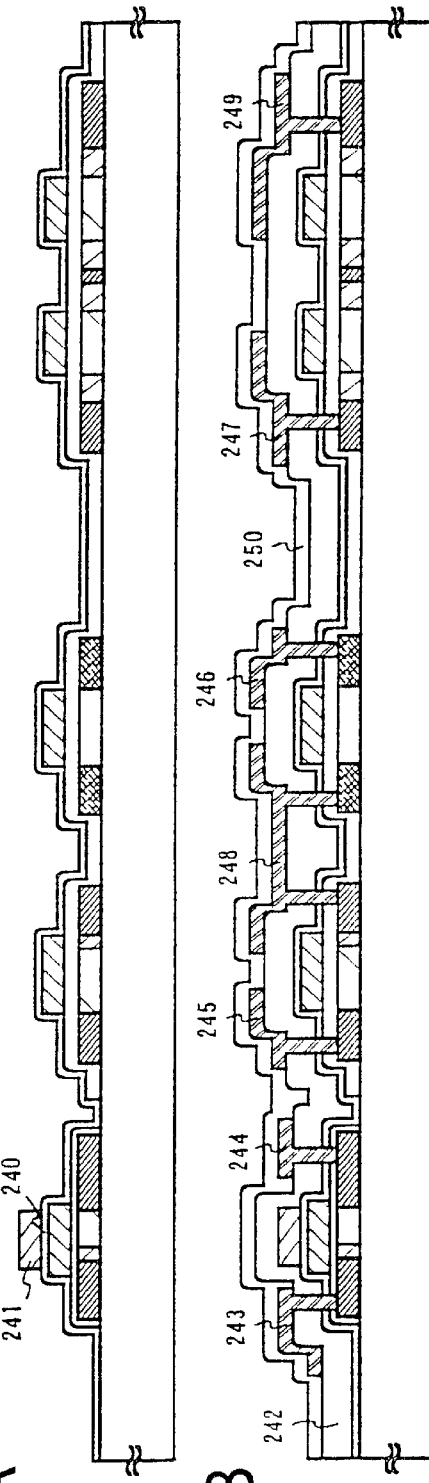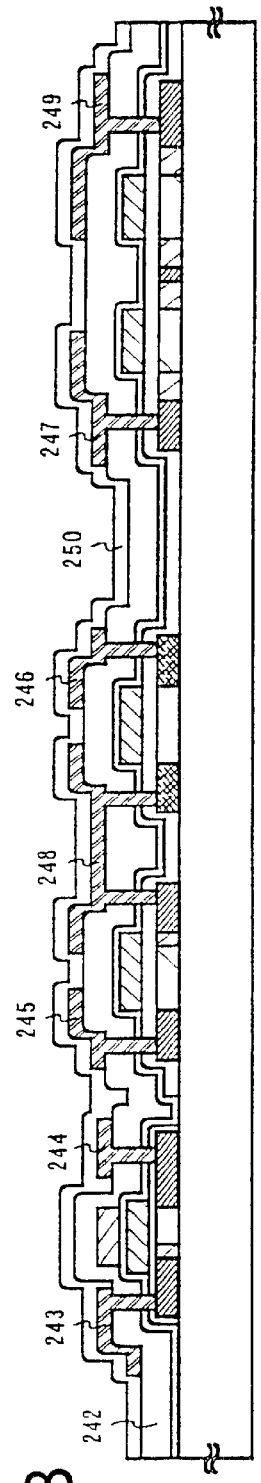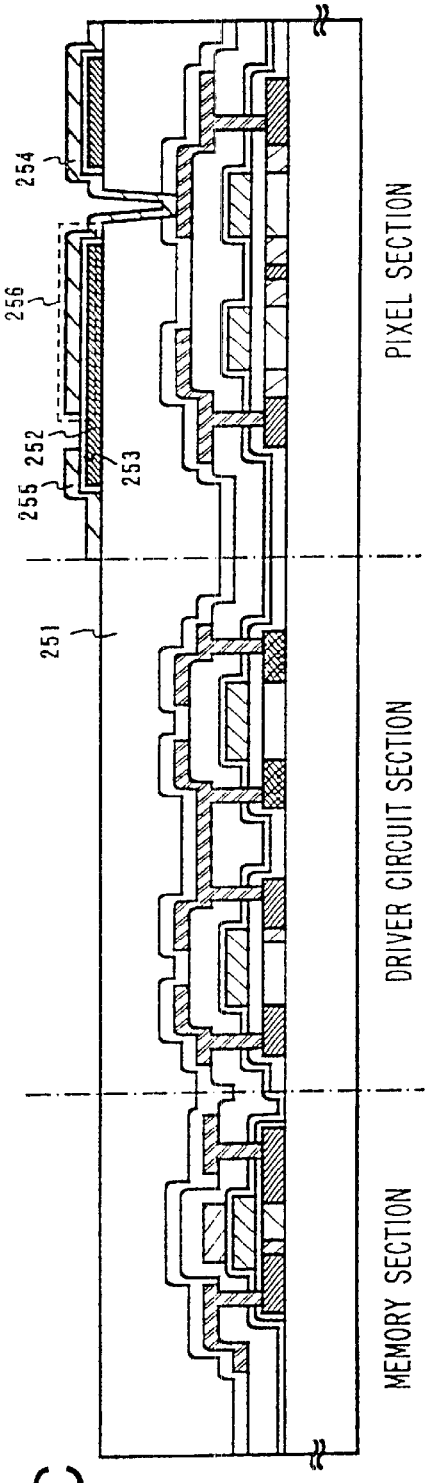
FIG. 5A
FIG. 5B
FIG. 5C

| CMOS CIRCUIT FORMING SHIFT REGISTER AND BUFFER | n-CHANNEL TFT FORMING SAMPLING CIRCUIT |

OPTICAL ENGINE (THREE PLATE TYPE)

OPTICAL LIGHT SOURCE SYSTEM

ELECTRO-OPTICAL DEVICE AND ELECTRONIC EQUIPMENT

This is a division of application Ser. No. 09/547,736 filed Apr. 11, 2000, now U.S. Pat. No. 6,498,369.

BACKGROUND OF THE INVENTION

1. Field of the Invention

The present invention relates to an electro-optical device formed by a semiconductor element (an element using a semiconductor thin film) made over a substrate surface, and to electronic equipment (an electronic device) having this electro-optical device. Typically, the present invention relates to a liquid crystal display device or an EL display device in which a thin film transistor (hereinafter referred to as a TFT) is formed over a substrate, and to electronic equipment having that kind of display device as a display (a display section).

2. Description of the Related Art

Techniques of manufacturing a TFT on a substrate have been greatly advancing in recent years, and development of applications in active matrix type display devices is proceeding apace. In particular, a TFT using a polysilicon film has an electric field effect mobility (also called mobility) which is higher than that of a conventional TFT using an amorphous silicon film, and high speed operation is consequently possible. Therefore, it becomes possible to perform pixel control, which is conventionally carried out by a driver circuit outside of the substrate, by a driver circuit formed on the same substrate as the pixel.

This type of active matrix display device has been in the spotlight because several kinds of advantages can be obtained by making various circuits and elements on the same substrate, such as: reduced manufacturing cost, miniaturization of the display device, an increase in yield, and an increase in throughput.

However, circuits and elements having many functions are formed on the substrate of the active matrix display device. The performance of the TFTs required by the respective circuits and elements, therefore, differs when forming the circuits and elements from TFTs. For example, a TFT having high speed operation is required by driver circuits such as a shift register circuit, while a TFT with a sufficiently low off current value (the drain current value flowing when the TFT is in the off operation state) is required by switching elements in a pixel section.

In this case it becomes difficult to ensure the performance required by all of the circuits and elements by TFTs having the same structure, and this affects seriously in raising the performance of the active matrix display device.

In addition, many circuits other than the above pixel and driver circuits are necessary when using the active matrix display device as a part of electronic equipment. In particular, the formation of a memory section for temporarily recording image information on the same substrate is of great importance in expanding uses of the active matrix display device.

SUMMARY OF THE INVENTION

An object of the present invention is to provide an electro-optical device having high operation performance and reliability, in which a TFT, with a proper structure to obtain the performance required by circuits and elements formed of TFTs, is used in an active matrix type electro-optical device having a pixel section and a driver circuit section on the same substrate.

Specifically, an object of the present invention is to provide an electro-optical device having high operation performance and reliability, with proper TFT structures for a pixel section, a driver circuit section, and a memory section, respectively, formed on the same substrate.

Another object of the present invention is to improve performance and to improve picture quality of a display device by adding a memory function to an active matrix type electro-optical device. In addition, another object of the present invention is to improve the quality of electronic equipment which uses the electro-optical device of the present invention as a display.

According to a structure of the present invention, an electro-optical device comprising:

a driver circuit section having an n-channel TFT in which a portion of an LDD region, or the entire LDD region, is formed so as to overlap a gate electrode with a gate insulating film sandwiched therebetween;

a pixel section having a pixel TFT in which an LDD region is formed so as not to overlap a gate electrode with the gate insulating film sandwiched therebetween; and a memory section having a memory transistor, is characterized in that the driver circuit section, the pixel section and the memory section are formed on the same insulator.

According to another structure of the present invention, an electro-optical device comprising:

a driver circuit section having an n-channel TFT in which a portion of an LDD region, or the entire LDD region, is formed so as to overlap a gate electrode with a second gate insulating film sandwiched therebetween;

a pixel section having a pixel TFT in which an LDD region is formed so as not to overlap a gate electrode with the second gate insulating film sandwiched therebetween; and a memory section having a memory transistor containing an active layer, a first gate insulating film, a floating gate electrode, a third gate insulating film, and a control gate electrode, is characterized in that the driver circuit section, the pixel section and the memory section are formed on the same insulator.

According to another structure of the present invention, an electro-optical device comprising:

a driver circuit section having an n-channel TFT in which a portion of an LDD region, or the entire LDD region, is formed so as to overlap a gate electrode with a second gate insulating film sandwiched therebetween;

a pixel section having a pixel TFT in which an LDD region is formed so as not to overlap a gate electrode with the second gate insulating film sandwiched therebetween; and a memory section having a memory transistor containing an active layer, a first gate insulating film, a floating gate electrode, a third gate insulating film, and a control gate electrode, is characterized in that the driver circuit section, the pixel section and the memory section are formed on the same insulator, and in that the third gate insulating film covers the gate electrode of the n-channel TFT and the gate electrode of the pixel TFT.

According to another structure of the present invention, an electro-optical device comprising:

a driver circuit section having an n-channel TFT in which a portion of an LDD region, or the entire LDD region, is formed so as to overlap a gate electrode with a second gate insulating film sandwiched therebetween;

a pixel section having a pixel TFT in which an LDD region is formed so as not to overlap a gate electrode with the second gate insulating film sandwiched therebetween; and a memory section having a memory transistor containing an active layer, a first gate insulating film, a floating gate electrode, a third gate insulating film, and a control gate electrode, is characterized in that the driver circuit section, the pixel section and the memory section are formed on the same insulator, and in that the floating gate electrode, the gate electrode of the n-channel TFT, and the gate electrode of the pixel TFT are made from the same material, and are covered by the third gate insulating film.

According to another structure of the present invention, an electro-optical device comprising:

a driver circuit section having an n-channel TFT in which a portion of an LDD region, or the entire LDD region, is formed so as to overlap a gate electrode with a second gate insulating film sandwiched therebetween;

a pixel section having a pixel TFT in which an LDD region is formed so as not to overlap a gate electrode with the second gate insulating film sandwiched therebetween; and a memory section having a memory transistor containing an active layer, a first gate insulating film, a floating gate electrode, a third gate insulating film, and a control gate electrode, is characterized in that the driver circuit section, the pixel section and the memory section are formed on the same insulator, and in that the third gate insulating film is an oxide of the material forming the floating gate electrode.

According to another structure of the present invention, an electro-optical device comprising:

a driver circuit section having an n-channel TFT in which a portion of an LDD region, or the entire LDD region, is formed so as to overlap a gate electrode with a second gate insulating film sandwiched therebetween;

a pixel section having a pixel TFT in which an LDD region is formed so as not to overlap a gate electrode with the second gate insulating film sandwiched therebetween; and a memory section having a memory transistor containing an active layer, a first gate insulating film, a floating gate electrode, a third gate insulating film, and a control gate electrode, is characterized in that the driver circuit section, the pixel section and the memory section are formed on the same insulator, and in that the floating gate electrode, the gate electrode of the n-channel TFT, and the gate electrode of the pixel TFT are made from the same material, and the third gate insulating film is an oxide of the material forming the floating gate electrode.

BRIEF DESCRIPTION OF THE DRAWINGS

In the accompanying drawings:

FIGS. 2A to 2E are diagrams showing a process of manufacturing a pixel section, a driver circuit, and a memory section;

FIGS. 3A to 3E are diagrams showing the process of manufacturing the pixel section, the driver circuit, and the memory section;

FIGS. 4A to 4D are diagrams showing the process of manufacturing the pixel section, the driver circuit, and the memory section;

FIGS. 5A to 5C are diagrams showing the process of manufacturing the pixel section, the driver circuit, and the memory section;

DETAILED DESCRIPTION OF THE PREFERRED EMBODIMENTS

Figure 1:
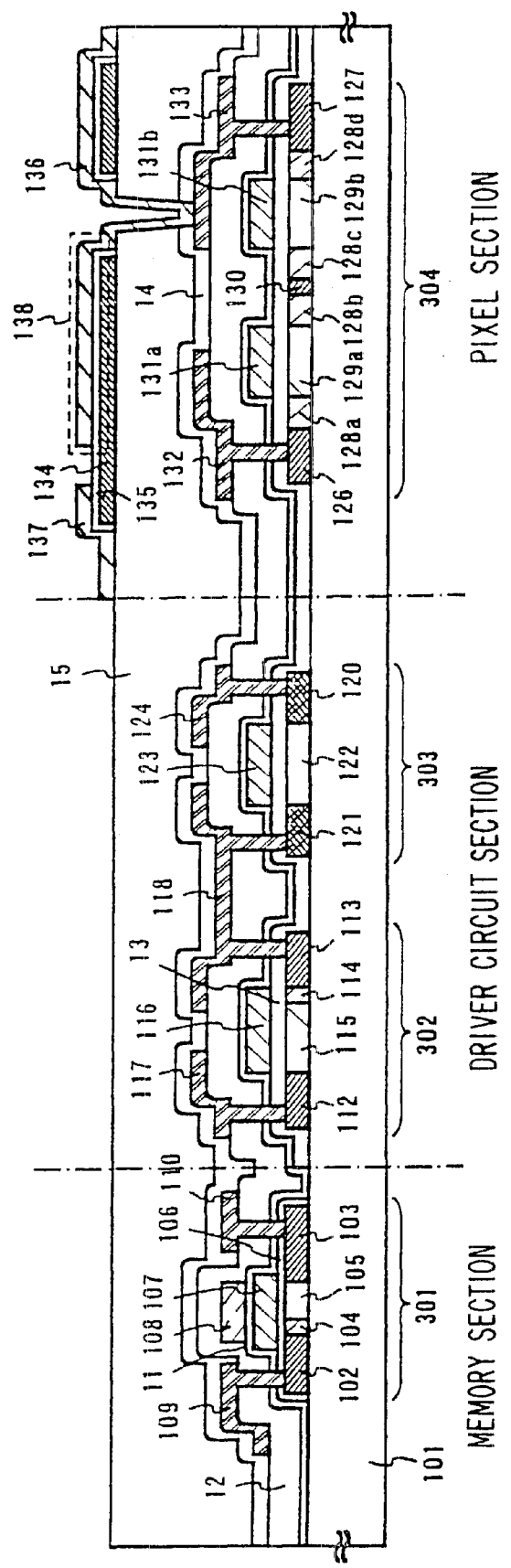
FIG. 1 is a diagram showing the structure of a pixel section, a driver circuit, and a memory section.

An embodiment mode of the present invention will be explained with reference to FIG. 1. FIG. 1 shows a cross sectional diagram of an active matrix substrate (the TFT forming side of a substrate before liquid crystal or EL layer formation) in which a memory section, a driver circuit section, and a pixel section are formed on the same substrate (on the same insulating surface or on the same insulator).

Note that the memory section is formed of a non-volatile memory, here an EEPROM (electrically erasable programmable read only memory), and an example of one memory transistor (also called memory cell transistor) formed in a memory cell is shown in FIG. 1. In practice, a multiple number of memory cells are integrated to form the memory section.

It is preferable to use a flash memory (flash EEPROM), which has a high integration degree, in the present invention. Therefore, when there is no particular prohibiting limit placed on the non-volatile memory, flash memory is used as the non-volatile memory throughout this specification. Further, flash memory is a non-volatile memory which performs data erasure for each sector, but source wirings for each memory transistor are made into a common line, and therefore referred to as a common source wiring throughout this specification.

Furthermore, a CMOS circuit is shown as a specific example of forming the driver circuit section. In practice, circuits such as a shift register, a level shifter, a latch, and a buffer are formed with the CMOS circuit as a basic circuit, and these circuits are integrated, forming the driver circuit section.

In addition, a pixel TFT and a capacitance storage are shown as a specific example forming the pixel section. In practice, the pixel TFT and the capacitance storage are formed for each of the multiple number of pixels arranged in a matrix state.

In FIG. 1, reference numeral 101 denotes a substrate with high thermal resistance having an insulating surface. A quartz substrate, a silicon substrate, a ceramic substrate, or a metallic substrate may be used as the substrate 101. Whichever substrate is used, a base film (preferably an insulating film containing silicon) may be formed when necessary, forming the insulating surface. Note that, through this specification, "insulating film containing silicon" specifically indicates an insulating film containing a predetermined ratio of silicon, oxygen, or nitrogen, such as a silicon oxide film; a silicon nitride film, or an oxidized silicon nitride film (expressed as $SiO_xN_y$).

Semiconductor elements 301 to 304 are then formed on the substrate 101. An explanation of each of the semiconductor elements 301 to 304 is given here with reference to FIG. 1.

First, the semiconductor element (memory transistor) 301 is formed to have: an active layer containing a source region 102, a drain region 103, a low concentration impurity region (also called an LDD region) 104, and a channel forming region 105; a first gate insulating film 106; a floating gate electrode 107; a third gate insulating film 11; a control gate electrode 108; a common source wiring 109 formed through a first interlayer insulating film 12; and a bit wiring (drain wiring) 110.

The source wiring 102 is a region for extracting the carrier (electron) caught in the floating gate electrode 107 to the common source wiring 109, and is also called an erasure region. Note that the LDD region 104 is formed between the source wiring 102 and the channel forming region 105 in FIG. 1, but it need not be formed. Further, the drain region 103 is a region for injecting the carrier into the electrically isolated floating gate electrode 107, and is also called a writing region. In addition, the drain region 103 functions as a reading region for reading out date stored in the memory transistor 301 to the bit wiring 110.

The drain region 103 is formed so as to overlap the floating gate electrode 107 through the first gate insulating film 106. The length of overlap may be from 0.1 to 0.5 μm (preferably between 0.1 and 0.2 μm). An overlap greater than this is not desirable because the parasitic capacity becomes too large. Further, when capturing the carrier in the floating gate electrode 107, control is performed by control gate electrode 108 formed on the floating gate electrode 107 through the third gate insulating film 11.

Note that it is necessary to make thin the insulating film for use as the first gate insulating film 106 (film thickness from 3 to 20 nm, preferably between 5 and 10 nm) to the extent that tunnel current (Fouler-Nordheim current) is allowed to flow, and therefore it is preferable to use an oxide film obtained by oxidation of the active layer (a silicon oxide film, provided that the active layer contains silicon). Of course the first gate insulating film can be formed by a vapor phase method such as CVD or sputtering, provided that the film thickness uniformity and the film quality are good.

Further, it is preferable to use an insulating film with a high specific dielectric constant as the third gate insulating film 11, and although not shown in FIG. 1, an insulating film made from a silicon oxide film/silicon nitride film/silicon oxide film laminate structure is used here. In this case, a portion of the third gate insulating film 11 contains a silicon nitride film, and therefore a passivation film effect of preventing penetration of mobile ions and moisture from the outside can be obtained for the other semiconductor elements 302 to 304. Furthermore, it is also possible to use an oxide film obtained by oxidizing the floating gate electrode 107 (a tantalum oxide film, provided that the floating gate electrode is a tantalum film).

Next, the semiconductor element (n-channel TFT) 302 which forms the CMOS circuit is formed to have: an active layer containing a source region 112, a drain region 113, an LDD region 114, and a channel forming region 115; a second gate insulating film 13; a gate electrode 116; a source wiring 117; and a drain wiring 118. At this point the film thickness of the second gate insulating film 13 is set from 50 to 150 nm (preferably between 80 and 120 nm), and one having a film thickness which is greater than the film thickness of the first gate insulating film 106 used in the memory transistor 301 is used.

The characteristics of the n-channel TFT are that the LDD region 114 is formed between the drain region 113 and the channel forming region 115, and that the LDD region 114 overlaps the gate electrode 116 through the second gate insulating film 13. This kind of structure is extremely effective in preventing deterioration due to hot carrier injection. However, a parasitic capacity is undesirably formed between the LDD region and the gate electrode, and therefore it is preferable not to form this between the source region 112 and the channel forming region 115.

Further, the length of the LDD region 114 at this time may be from 0.1 to 2 μm (preferably between 0.3 and 0.5 μm). If it is too long, then the parasitic capacity becomes large, and if it is too short, then the prevention of deterioration due to hot carrier injection effect becomes weak.

Next, the semiconductor element (p-channel TFT) 303 forming the CMOS circuit is formed to have: an active layer containing a source region 120, a drain region 121, and a channel forming region 122; the second gate insulating film 13; a gate electrode 123; a source wiring 124; and the drain wiring 118. The same insulating film is used at this point for the second gate insulating film as that of the n-channel TFT 302, and the drain wiring is common with the n-channel TFT 302.

Next, the semiconductor element (pixel TFT) 304 forming the pixel section is formed to have: an active layer containing a source region 126, a drain region 127, LDD regions 128a to 128d, channel forming regions 129a and 129b, and an impurity region 130; the second gate insulating film 13; gate electrodes 131a and 131b; a source wiring 132; and a drain wiring 133.

At this point it is preferable to form the LDD regions 128a to 128d in the pixel TFT 304 so that they do not overlap the gate electrodes 131a and 131b through the second gate insulating film 13. Note that it is additionally preferable to form an offset region between the channel forming regions and the LDD regions (a region which is formed of a semiconductor layer having the same composition as the channel forming region and to which a gate voltage is not applied).

The structure used in the above n-channel TFT 302 is certainly effective as a measure against hot carriers, but on the other hand, a phenomenon in which the off current value (the value of the drain current when the TFT is in the off operation state) becomes large is seen. This phenomenon does not become much of a problem for the driver circuits (except for the sampling circuit), but becomes a fatal fault for the pixel TFT. Therefore, a pixel TFT having a structure like that of FIG. 1 is used in the present invention, reducing the value of the off current. Further, the impurity region 130 is also extremely effective in reducing the off current value.

A passivation film 14 which is common to all elements is formed on the pixel TFT, and a second interlayer insulating film 15 is formed on the passivation film 14 from an insulating film with a high degree of evenness, such as a resin film. A shielding film 134 from a metallic film, an oxide 135 obtained by oxidizing the shielding film 134, and a pixel electrode 136 for connecting to the pixel TFT 304 through a contact hole formed in the second interlayer insulating film are then formed on the second interlayer insulating film 15.

Note that reference numeral 137 denotes a pixel electrode of another neighboring pixel, and that a capacitance storage 138 is formed by the overlap of the pixel electrode 136 and the shielding film 135, through the oxide 135. In other words, one of the characteristics of the structure shown in FIG. 1 that can be given is that the capacitance storage 138 functions as a light shielding film and an electric field shielding film. However, the present invention is not limited to the structure of the capacitance storage shown in FIG. 1.

By thus using appropriate structures, as above, which respond to the respective performance requirements of the memory transistor 301, the n-channel TFT 302 forming the CMOS circuit, the p-channel TFT 303 forming the CMOS circuit, and the pixel TFT 304, the operating performance and the reliability of the active matrix display device are greatly increased.

In addition, it is possible to form the memory section along with the driver circuit section and the pixel section on the same substrate without adding any complex steps, and therefore it becomes possible to form the active matrix display device with even higher capabilities than those of a conventional active matrix display device.

Furthermore, signal processing circuits other than the above memory section, driver circuit section, and pixel section can also be formed. The following can be given as examples of other signal processing circuits: a signal divider circuit, a D/A converter, a γ compensation circuit, a voltage booster circuit, and a differential amplifier circuit.

An even more detailed explanation of the present invention structured as above is made with embodiments shown below.

Embodiment 1

An embodiment of the present invention will be explained with reference to FIGS. 2A to 5C. In Embodiment 1, a method of manufacturing the following, at the same time on the same substrate, is explained: a pixel section, a driver circuit section to drive the pixel section, and a memory section for temporarily storing signal information to the pixel section. At completion, an active matrix substrate having the structure shown in FIG. 1 is manufactured.

In FIG. 2A, it is preferable to use a quartz substrate or a silicon substrate as a substrate 201. A quartz substrate is used in this embodiment. In addition, a metallic substrate having an insulating film on its surface may also be used. A thermal resistance capable of withstanding 800° C. or higher is required in Embodiment 1, and any type of substrate may be used, provided that it can satisfy this requirement.

A semiconductor film 202 containing an amorphous structure with a thickness of 20 to 100 nm (preferably between 40 and 80 nm) is formed on the surface of the substrate 201, on which the TFTs are to be formed, by a method such as low pressure thermal CVD, plasma CVD, or sputtering. Note that although a 60 nm thick amorphous silicon film is formed in Embodiment 1, this film thickness is not the film thickness of the final TFT active layers because of a later oxidation step.

An amorphous silicon film and a microcrystalline semiconductor film exist as semiconductor films containing an amorphous structure, and a compound semiconductor film containing an amorphous structure, such as an amorphous silicon germanium film, may also be used. In addition, it is effective to form a base film and an amorphous silicon film on the substrate in succession, without exposure to the atmosphere. By doing so, it is possible to prevent contaminants on the surface of the substrate from influencing the amorphous silicon film, and fluctuation in the characteristics of the manufactured TFTs can be reduced.

A mask film 203 is formed next on the amorphous silicon film 202 from an insulating film containing silicon, and openings 204a and 204b are formed by patterning. The openings become doped regions for the next crystallization step by being doped with a catalytic element which promotes crystallization. (See FIG. 2A.)

Note that a silicon oxide film, a silicon nitride film, or a nitrided silicon oxide film can be used as the insulating film containing silicon. An nitrided silicon oxide film is an insulating film denoted by $SiO_xN_y$, and contains silicon, nitrogen, and oxygen in predetermined amounts. It is possible to manufacture an nitrided silicon oxide film by using $SiH_4$, $N_2O$, and $NH_3$ as raw material gasses, and the concentration of contained nitrogen can be changed with a 5 to 50 atomic % range.

Further, at the same time that patterning of the mask film 203 is performed, a marker pattern, which becomes a standard for a later patterning step, is formed. The amorphous silicon film 202 is also slightly etched during the etching of the mask film 203, but this step difference can be used as the marker pattern during later mask alignment.

A semiconductor film containing a crystalline structure is formed next in accordance with the technique disclosed in Japanese Patent Application Laid-open No. Hei 10-247735. The technique disclosed in this publication is a means of crystallization using a catalytic element (a single or multiple number of elements chosen from among nickel, cobalt, germanium, tin, lead, palladium, iron, and copper) to promote crystallization when a semiconductor film containing an amorphous structure is crystallized.

Specifically, heat treatment is performed while the catalytic element is maintained in the surface of the semiconductor film containing the amorphous structure, and the semiconductor film containing the amorphous structure is changed into a semiconductor film containing a crystalline structure. Note that the technique disclosed in Embodiment 1 of Japanese Patent Application Laid-open No. Hei 7-130652 may also be used as a means of crystallization. Further, so-called single crystal semiconductor films and polycrystalline semiconductor films are both included in the term semiconductor film containing a crystalline structure, but the semiconductor film containing the crystalline structure formed in the above publication has grain boundaries.

Note that spin coating is used in the above publication when forming a catalytic element containing layer on the mask film, but a thin film containing the catalytic element may also be formed by a deposition means using the vapor phase such as sputtering or evaporation.

Furthermore, it is preferable to crystallize after hydrogen is sufficiently desorbed by performing heat treatment for approximately 1 hour, preferably at between 400 and 550° C., although it depends on the amount of hydrogen contained in the amorphous silicon film. In this case, it is desirable that the amount of contained hydrogen be reduced to 5 atomic % or less.

The crystallization step consists of first performing heat treatment at 400 to 500° C. for approximately 1 hour, and then after hydrogen is desorbed from within the film, performing heat treatment at between 500 and 650° C. (preferably from 550 to 600° C.) for 6 to 16 hours (preferably between 8 and 14 hours).

Nickel is used as the catalytic element in Embodiment 1, and heat treatment is performed for 14 hours at 570° C. As a result, crystallization proceeds roughly in parallel with the substrate (the direction shown by the arrows) with the openings 204a and 204b as origins, and semiconductor films containing a crystalline structure in which the crystal growth directions are aligned macroscopically (crystalline silicon films in Embodiment 1) 205a to 205d are formed. (See FIG. 2B.)

A gettering step for removing the nickel, used in the crystallization step, from the crystalline silicon film is performed next. The previously formed mask film 203 is left as a mask and a periodic table group 15 element (phosphorous in Embodiment 1) doping step is performed, forming phosphorous doped regions (hereafter referred to as gettering regions) 206a and 206b in the crystalline silicon film exposed at the openings 204a and 204b, and containing phosphorous at a concentration of between $1 \times 10^{19}$ and $1 \times 10^{20}$ atoms/cm$^3$. (See FIG. 2C.)

Heat treatment step is then performed in a nitrogen atmosphere at 450 to 650° C. (preferably from 500 to 550° C.) for 4 to 24 hours (preferably between 6 and 12 hours). Nickel in the crystalline silicon film moves in the direction of the arrows in this heat treatment step, and is captured in the gettering regions 206a and 206b by a gettering action of phosphorous. In other words, nickel is removed from within the crystalline silicon film, and therefore the concentration of nickel contained in the crystalline silicon films 207a to 207d can be reduced to $1 \times 10^{17}$ atoms/cm$^3$ or less, preferably to $1 \times 10^{16}$ atoms/cm$^3$ or less, after gettering.

The mask film 203 is then removed, and a protective film 208 is formed on the crystalline silicon films 207a to 207d for later impurity doping. A nitrided silicon oxide film or a silicon oxide film with a film thickness of 100 to 200 nm (preferably 130 to 170 nm) may be used as the protective film 208. The protective film 208 is formed so that the crystalline silicon film is not exposed directly to the plasma during impurity doping, and so that fine concentration control is possible.

Resist masks 209a and 209b are then formed, and an impurity element which imparts p-type conductivity (hereafter referred to as a p-type impurity element) is doped through the protective film 208. A periodic table group 13 element, typically boron or gallium, can be used as the p-type impurity element. This step (also referred to as a channel doping step) is one for controlling the TFT threshold voltage. Note that boron is doped in Embodiment 1 by ion doping using diborane ($B_2H_6$) plasma-excited instead of performing separation of mass. Of course, an)ion implantation method which performs mass separation may also be used.

Impurity regions 210a to 210c, containing the p-type impurity element (boron in Embodiment 1) at a concentration of between $1 \times 10^{15}$ and $1 \times 10^{18}$ atoms/cm$^3$ (typically from $5 \times 10^{16}$ to $5 \times 10^{17}$ atoms/cm$^3$), are thus formed in this step. Note that an impurity region containing a p-type impurity element in the above concentration range (however, a region which does not contain phosphorous) is defined as a p-type impurity region (b) throughout this specification. (See FIG. 2D.)

The resist masks 209a and 209b are next removed, and the crystalline silicon film is patterned, forming island shape semiconductor layers (hereafter referred to as active layers) 211 to 214. Note that by selectively doping nickel and then performing crystallization, the active layers 211 to 214 are formed of crystalline silicon films having extremely good crystallinity. Specifically, they have a crystal structure in which cylindrical shape or cylindrical shape crystals are lined up with a specific directionality. Further, after crystallization, the nickel is either removed or reduced by the gettering action, and the concentration of the catalytic element remaining in the active layers 211 to 214 is $1 \times 10^{17}$ atoms/cm$^3$ or less, preferably $1 \times 10^{16}$ atoms/cm$^3$ or less. (See FIG. 2E.)

The active layer 213 of a p-channel TFT is a region that does not contain the intentionally doped impurity element, and the active layers 211, 212, and 214 of n-channel TFTs are p-type impurity regions (b). The active layers 211 to 214 in this state are defined as being completely intrinsic or essentially intrinsic throughout this specification. In other words, the regions in which the impurity element is intentionally doped at a level which does not hinder TFT operation may be considered essentially intrinsic regions.

A silicon containing insulating film is formed next by plasma CVD or sputtering to a thickness of between 10 and 100 nm. A 30 nm thick nitrided silicon oxide film is formed in Embodiment 1. A laminate structure may be used for the silicon containing insulating film. Patterning is then performed, leaving only the regions which become the driver circuit section and the pixel section, removing other regions, and exposing the active layer 211.

A heat treatment step (a thermal oxidation step) is then performed under an oxidizing atmosphere at a temperature of 800 to 1150° C. (preferably between 900 and 1000° C.) for between 15 minutes and 8 hours (preferably from 30 minutes to 2 hours). Heat treatment is performed in Embodiment 1 at 950° C. for 80 minutes in an oxygen atmosphere which has a 3 volume % of hydrochloric acid added. Note that the boron doped by the step of FIG. 2D is activated during this thermal oxidation step. (See FIG. 3A.)

Note that both a dry oxygen atmosphere and a wet oxygen atmosphere may be used as the oxidizing atmosphere, but a dry oxygen atmosphere is suitable in reducing crystal defects in the semiconductor film. Furthermore, an atmosphere containing a halogen element in an oxygen atmosphere is given in Embodiment 1, but the thermal oxidation step may also be performed in a 100% oxygen atmosphere.

A thermal oxide film (a silicon oxide film) 215 with a film thickness of 3 to 20 nm (preferably from 5 to 10 nm) is thus formed on the surface of the exposed active layer 211. The thermal oxide film 215 ultimately becomes a first gate insulating film formed between a channel forming region and a floating gate electrode of a memory transistor.

An oxidation reaction also proceeds at the same time in the interfaces between the silicon containing insulating film 116 and the active layers 211 to 214 below the film 116. Taking this into consideration, the film thickness of an insulating film 216 is regulated to have a final film thickness of from 50 to 150 nm (preferably between 80 and 120 nm) in the present invention. The silicon containing insulating film 216 is ultimately a gate insulating film of TFTs forming the driver circuit section and the pixel section, and is also called a second gate insulating film.

Further, 25 nm of the 60 nm thick active layers become oxidized by the thermal oxidation step of Embodiment 1, and the film thickness of the active layers 211 to 214 becomes 45 nm. This is the final film thickness of the completed TFT active layers. Furthermore, a 50 nm thick thermal oxide film is added to the 30 nm thick silicon containing insulating film, and therefore the final film thickness of the second gate insulating film 216 becomes 110 nm.

New resist masks 217a to 217c are formed next. An impurity element which imparts n-type conductivity (hereafter referred to as an n-type impurity element) is then doped, forming n-type presenting impurity regions 218 and 219. Note that a periodic table group 15 element, typically phosphorous or arsenic, can be used as the n-type impurity element. (See FIG. 3B.)

The impurity regions 218 and 219 are impurity regions which later function as LDD regions in the memory transistor and the n-channel TFT of the CMOS circuit. Note that the n-type impurity element is contained at a concentration of between $2\times10^{16}$ and $5\times10^{19}$ atoms/cm$^3$ (typically from $5\times10^{17}$ to $5\times10^{18}$ atoms/cm$^3$) in the impurity regions formed here. An impurity region containing an n-type impurity element in the above concentration range is defined as an n-type impurity region (b) throughout this specification.

Note that phosphorous is doped at a concentration of $1\times10^{18}$ atoms/cm$^3$ here by ion doping using phosphine (PH$_3$) plasma-excited instead of performing mass separation. Of course, an ion implantation method which performs separation of mass may also be used.

The film thicknesses of the gate insulating film in the region which becomes the memory transistor, and the region which becomes the n-channel TFT of the CMOS circuit, differs in this process. Therefore, the doping step may be performed by being divided into two steps. It is preferable to regulate the concentration profile in the depth direction during impurity doping so that phosphorous is doped into the regions denoted by reference numerals 218 and 219 at nearly the same concentration.

The resist masks 217a to 217c are removed next, and new resist masks 220a to 220c are formed. An n-type impurity element is then doped, forming n-type presenting impurity regions 221 and 222. Note that a periodic table group 15 element, typically phosphorous or arsenic, can be used as the n-type impurity element. (See FIG. 3C.)

The impurity regions 221 and 222 are impurity regions which later function as a source region and a drain region of the memory transistor. Note that the n-type impurity element is contained at a concentration of $1\times10^{20}$ and $1\times10^{21}$ atoms/cm$^3$ (typically from $2\times10^{20}$ to $5\times10^{21}$ atoms/cm$^3$) in the impurity regions formed here. An impurity region containing an n-type impurity element in the above concentration range is defined as an n-type impurity region (a) throughout this specification.

Note that phosphorous is doped at a concentration of $3\times10^{20}$ atoms/cm$^3$ here by ion doping using phosphine (PH$_3$) plasma-excited instead of performing mass separation. Of course, an ion implantation method which performs mass separation may also be used.

Heat treatment is performed next at 600 to 1000° C. (preferably between 700 and 800° C.) in an inert atmosphere, activating the phosphorous doped in the step of FIG. 3B. Heat treatment is performed at 800° C. for 1 hour in a nitrogen atmosphere in Embodiment 1. (See FIG. 3D.)

At this point it is possible to restore the crystallinity of the active layers which has been damaged during phosphorous doping, and to restore the interface between the active layers and the gate insulating film at the same time. Furnace annealing using an electric furnace is preferable for the activation step, but light annealing such as lamp annealing or laser annealing may also be performed, and these can be performed in combination with furnace annealing.

The boundaries of the n-type impurity region (a) 222, and the n-type impurity regions (b) 218 and 219, namely the junctions with the intrinsic, or essentially intrinsic, regions (also including p-type impurity regions (b), of course) existing in the periphery of the n-type impurity region (a) and the n-type impurity regions (b), are thus delineated in this step. This means that extremely good junctions are formed between the LDD regions and the channel forming regions when the TFTs are later completed.

First gate electrodes 223 to 225, 226a, and 226b are formed next with a thickness of between 200 and 400 nm (preferably between 250 and 350 nm). First gate wirings for making electrical connections between the first gate electrodes are formed at the same time as the first gate electrodes 223 to 225, 226a, and 226b are formed. However, the first gate electrode 223 is not connected with any other gate electrode, and later functions as the floating gate electrode of the memory transistor. (See FIG. 3E.)

In practice, a floating gate electrode is formed for all of the multiple number of memory transistors forming the memory section, and each is in an electrically isolated state, namely, a floating state. By doing so, this functions as an electric charge accumulation layer.

An element chosen from among tantalum (Ta), titanium (Ti), molybdenum (Mo), tungsten (W), chromium (Cr), and silicon (Si), or a conductive film having one of the above elements as its principal constituent (typically a tantalum nitride film a tungsten nitride film or a titanium nitride film), or an alloy film of a combination of the above elements (typically an Mo—W alloy, an Mo—Ta alloy, or a tungsten silicide film) can be used as the material of the gate electrodes 223 to 225, 226a, and 226b.

A 50 nm thick tantalum nitride (TaN) film, and a 350 nm thick tantalum (Ta) film are laminated and used in Embodiment 1. Further, it is effective to form a silicon film with a thickness on the order of 2 to 20 nm under the first gate electrodes. The adhesion of the gate electrodes formed thereon can be increased, and oxidation can be prevented by doing so.

The gate electrode 223 formed in the memory transistor is formed at this point so as to overlap the n-type impurity regions (a) 221 and 222, and a portion of the n-type impurity region (b) 218, through the gate insulating film 215. Furthermore, the gate electrode 224 formed in the n-channel TFT of the CMOS circuit is formed so as to overlap a portion of the n-type impurity region (b) 219 through the gate insulating film 216. Note that the gate electrodes 226a and 226b can be seen as two electrode in cross section, but they are actually electrically connected.

Resist masks 227a and 227b are formed next, and a p-type impurity element (boron in Embodiment 1) is doped, forming impurity regions 228 and 229 containing a high concentration of boron. Boron is doped in Embodiment 1 to a concentration of $3 \times 10^{20}$ to $3 \times 10^{21}$ atoms/cm$^3$ (typically from $5 \times 10^{20}$ and $1 \times 10^{21}$ atoms/cm$^3$) by ion doping (an ion implantation method may also be used, of course) using diborane ($B_2H_6$). An impurity region containing a p-type impurity element at the above concentration range is defined as a p-type impurity region (a) throughout this specification. (See FIG. 4A.)

Note that the gate insulating film may be etched here with the resist masks 227a and 227b, and the gate electrode 225 as masks, exposing the active layer before doping the p-type impurity element. The acceleration voltage and the dose amount can be made smaller by doing so, and the throughput in this step can be increased.

The resist masks 227a and 227b are removed next, and resist masks 230a to 230d are formed. An n-type impurity element (phosphorous in Embodiment 1) is then doped, forming impurity regions 231 to 235 containing a high concentration of phosphorous. This step may be performed similar to that of FIG. 3C, and the phosphorous concentration may be set at $1 \times 10^{20}$ to $1 \times 10^{21}$ atoms/cm$^3$ (typically between $2 \times 10^{20}$ and $5 \times 10^{21}$ atoms/cm$^3$). The impurity regions 231 to 235 may, therefore, be called n-type impurity regions (a). (See FIG. 4B.)

Further, phosphorous or boron doped by in the prior steps is already contained in the regions forming the impurity regions 231 to 235, but phosphorous is doped at a sufficiently high concentration, and therefore there is no influence imparted by the phosphorous or boron doped in the prior steps.

Note that the gate insulating film may be etched here with the resist masks 230a to 230d, and the gate electrode 224 as masks, exposing the active layer before doping the n-type impurity element. The acceleration voltage and the dose amount can be made smaller by doing so, and the throughput in the step can be increased.

The resist masks 230a to 230d are removed next, and an n-type impurity element (phosphorous in Embodiment 1) is doped in a self-aligning manner with the gate electrodes 223 to 225, 226a, and 226b as masks. The phosphorous is regulated and doped into impurity regions 236 to 239 thus formed so that the regions have a concentration between one-tenth and one-half (typically between one-fourth and one-third), that of the above impurity regions (b). (However, the phosphorous concentration is 5 to 10 times higher than the concentration of boron doped in the above channel doping step, representatively, from $1 \times 10^{16}$ to $5 \times 10^{18}$ atoms/cm$^3$ typically between $3 \times 10^{17}$ and $3 \times 10^{18}$ atoms/cm$^3$.) An impurity region containing an n-type impurity element in the above concentration range (excluding p-type impurity regions, however) is defined as an n-type impurity region (c) throughout this specification. (See FIG. 4C.)

Note that, with the exception of portions covered by the gate electrodes, phosphorous is doped into all of the impurity regions at a concentration of $1 \times 10^{16}$ to $5 \times 10^{18}$ atoms/cm$^3$ in this step, but this does not have an influence on the function of each impurity region because of the extremely low concentration. Further, boron is doped into the n-channel impurity regions (b) 236 to 239 at a concentration of $1 \times 10^{15}$ to $1 \times 10^{18}$ atoms/cm$^3$ in the previous channel doping step, but phosphorous is doped here at a concentration which is 5 to 10 times that of boron contained in the p-type impurity regions (b), and therefore boron can be considered in this case as well to not have any influence on the function of the n-type impurity regions (b).

Heat treatment is performed next in order to activate the n-type and p-type impurity elements doped at the respective concentrations. This step can be performed by furnace annealing, laser annealing, lamp annealing, or more than one of these used together. When furnace annealing is used, it may be performed in an inert atmosphere at between 500 and 800° C., preferably between 550 and 600° C. Heat treatment is performed for 4 hours at 550° C. in Embodiment 1, activating the impurity elements. (See FIG. 4D.)

Note that a laminate film of a tantalum nitride film and a tantalum film is used as the gate electrode material in Embodiment 1, but that a tantalum film is extremely weak in terms of oxidation. It is necessary, therefore, to perform the activation step in an inert atmosphere which contains as little oxygen as possible. Specifically, it is preferable that an inert atmosphere with oxygen at 1 ppm or less (more preferably 0.1 ppm or less) be used.

Heat treatment is performed in Embodiment 1 in a 100% nitrogen atmosphere at 550° C. for 4 hours. When doing so, the substrate is placed inside a furnace at a temperature sufficiently low that oxidation does not proceed (between 100 and 200° C.), and then after a sufficiently long period (30 minutes to 1 hour) of nitrogen purge, heat treatment is performed. Care is also taken when removing the substrate by exposing the substrate to the atmosphere only after the temperature inside the furnace has fallen to the above sufficiently low temperature.

By paying very close attention when performing heat treatment (the activation step), although the surface of the gate electrodes will become slightly nitrided, an oxidation reaction can be prevented, causing no such inconvenience as to greatly increase the resistance do not develop.

A third gate insulating film 240 is formed next, covering the first gate electrodes 223 to 225, 226a, and 226b. Note that only the portion above the first gate electrode 223 actually functions as a gate insulating film, but for convenience of explanation, no naming distinction is made.

The third gate insulating film 240 may be formed by a known vapor phase method, and is formed by low pressure thermal CVD in Embodiment 1 in order to obtain a thin film with good film quality. Further, a three layer structure laminate film of a silicon nitride film sandwiched by silicon oxide films is used as the third gate insulating film in Embodiment 1. The total film thickness may be from 15 to 50 nm (preferably between 20 and 40 nm). A silicon oxide film (film thickness 10 nm)/silicon nitride film (film thickness 20 nm)/silicon oxide film (film thickness 10 nm) is used in Embodiment 1, but it is not necessary for the film to be limited to this, and it may be determined by considering the coupling coefficient.

A second gate electrode (control gate electrode) 241 is then formed in a position overlapping the first gate electrode 223 through the third gate insulating film 240. The second gate electrode 241 (control gate electrode) later functions as a control gate electrode of the memory transistor. The film thickness may be chosen in the range of 200 to 400 nm. (See FIG. 5A.)

The same material as that used for the first gate electrode can be used as the material of the second gate electrode 241, but the temperature in subsequent steps does not exceed a high of 450° C., and therefore any material may be used provided that it is a conductive film having heat resistance capable of withstanding that temperature. In particular, a metallic film containing low resistance aluminum or copper is preferable.

A first interlayer insulating film 242 is formed next. An insulating film containing silicon may be used as the first interlayer insulating film 242, specifically, a silicon nitride film, a silicon oxide film, a nitrided silicon oxide film, or a laminate film of a combination of these films may be used. Further, the film thickness may be from 400 nm to 1.5 $\mu$m. In Embodiment 1, plasma CVD is used to form a 1 $\mu$m thick silicon oxide film.

Heat treatment is performed next in an atmosphere containing 3 to 100% hydrogen at 300 to 450° C. for between 1 and 4 hours, hydrogenating the active layer. This step is one for terminating dangling bonds in the semiconductor layers by thermally activated hydrogen. Plasma hydrogenation (a hydrogenation step using hydrogen activated by a plasma) may be performed as another means of hydrogenation.

Contact holes are then formed to reach the source region or the drain region of the respective TFTs, and a common source wiring 243, a bit wiring 244, source wirings 245 to 247, and drain wirings 248 and 249 are formed. Note that the drain wiring 248 is common between the n-channel TFT and the p-channel TFT in order to form the CMOS circuit. Further, although not shown in the figures, a three layer structure laminate film of a 200 nm Ti film, a 500 nm aluminum film containing Ti, and a 100 nm TiN film formed in succession by sputtering is used as these wirings in Embodiment 1. (See FIG. 5B.)

In addition, an insulating film containing silicon is formed to a thickness of 50 to 500 nm (typically between 200 and 300 nm) as a protective film (also referred to as passivation film) 250 for protecting the TFT from external contamination. A 300 nm thick nitrided silicon oxide film is used in Embodiment 1, and prior to forming the passivation film, plasma processing using a gas containing hydrogen such as $H_2$ or $NH_3$ is performed, and then the film is deposited.

The hydrogen activated by the plasma in this pre-process is supplied throughout the first interlayer insulating film. By performing heat treatment (at a temperature of 300 to 420° C.) in this state, along with improvements in the film quality of the passivation film 250, the hydrogen doped into the first interlayer insulating film diffuses to the lower layers, and the active layers can effectively be hydrogenated.

Note that openings (not shown in the figure) may be formed in the passivation film 250 after the heat treatment step in locations at which contact holes for connecting to a pixel electrode and to the drain wiring are later formed. Further, when performing this step, if the passivation film is removed from an image display region inside the pixel, then the amount of light transmitted in a transmission type liquid crystal display device is increased and a bright image can be obtained.

A second interlayer insulating film 251 is formed next from an organic resin with a thickness of approximately 1 $\mu$m. Materials such as polyimide, acrylic, polyamide, polyimide amide, and BCB (benzocyclobutene) can be used as the organic resin. The following can be given as the advantages of using an organic resin film: the film deposition method is simple; the specific dielectric constant is low, and therefore the parasitic capacity can be reduced; and super levelness. Note that organic resin films other than the ones stated above, and an organic-based SiO compound can also be used. A polyimide of the type that is thermally polymerized after being applied to the substrate is used here, and this is burnt at 300° C. to form the second interlayer insulating film.

Next, a shielding film 252 is formed on the second interlayer insulating film 251 in the region which becomes the pixel section. Note that the term shielding film is used throughout this specification with the meaning of shielding from both light and electromagnetic waves. The shielding film 252 is formed with a thickness of between 100 and 300 nm from a film made up from an element chosen from aluminum (Al), titanium (Ti), and tantalum (Ta), or from a film having one of these elements as its principal constituent. A 125 nm thick aluminum film which contains 1 wt % titanium is formed in Embodiment 1.

Note that if a 5 to 50 nm insulating film such as a silicon oxide film is formed on the second interlayer insulating film 251, then the adhesion of the shielding film formed on top of this can be increased. This effect is also obtained by using a conductive film such as titanium nitride. Further, if plasma processing using $CF_4$ gas is performed on the surface of the second interlayer insulating film 251, formed from an organic resin, then the adhesion of the shielding film formed on the second interlayer insulating film 251 can be increased due to an improved quality surface.

In addition, it is possible to form not only the shielding film, but also connecting lines using an aluminum film containing titanium. For example, connecting wirings which connect circuits within the driver circuit can be formed. In this case, however, before depositing the material which forms the shielding film or the connection lines, it is necessary to form contact holes ahead of time in the second interlayer insulating film.

An oxide (anodic oxide) 253 is formed next on the surface of the shielding film 252 by anodic oxidation or plasma oxidation (anodic oxidation is used in Embodiment 1) to a thickness of between 20 and 100 nm (preferably between 30 and 50 nm). A film with aluminum as its principal constituent is used in Embodiment 1 as the shielding film 252, and therefore an aluminum oxide film (alumina film) is formed as the anodic oxide 253.

When performing anodic oxide processing, an ethylene glycol tartrate solution is first manufactured. This is a solution in which a 15% aqueous solution of ammonium tartrate and ethylene glycol are mixed at a ratio of 2:8, and aqueous ammonia is added so that the pH is regulated to be 7±0.5. A platinum electrode is then formed in the solution as a cathode, the substrate on which the shielding film 252 has been formed is immersed in the solution, and a constant direct current (from several mA to several tens of mA) is applied with the shielding film 252 as an anode.

The voltage between the cathode and the anode in the solution changes with time in accordance with the growth of the anodic oxide. With a constant current, the voltage increases at a rate of 100 V/min, and the anodic oxidation processing is ended when the voltage reaches an arrival voltage of 45 V. The anodic oxide 253 can thus be formed with a thickness of approximately 50 nm in the surface of the shielding film 252. Further, the film thickness of the shielding film 252 becomes 90 nm as a result.

Note that the numerical values related to the anodic oxidation method shown here are only examples, and that they naturally should be changed to optimal values depending upon factors such as the size of the element being manufactured.

Furthermore, the structure here forms the insulating film only in the surface of the shielding film by using anodic oxidation, but the insulating film may also be formed by a vapor method such as plasma CVD, thermal CVD, or sputtering. In that case as well, it is preferable that the film thickness be from 20 to 100 nm (even desirably between 30 and 50 nm). Further, a silicon oxide film, a silicon nitride film, an nitrided silicon oxide film, a carbon film such as DLC (diamond like carbon), and an organic resin film may also be used. In addition, a laminate film of a combination of these films may also be used.

Next, contact holes are formed in the second interlayer insulating film 251 and in the passivation film 250 in order to reach the drain wiring 249, and a pixel electrode 254 is formed. Note that a pixel electrodes 255 is a pixel electrode of a separate neighboring pixel. A transparent conductive film may be used for the pixel electrodes 254 and 255 when a transmission type liquid crystal display device is manufactured, and a metallic film may be used when a reflective type liquid crystal display device is manufactured. A transmission type liquid crystal display device is made here, and therefore an indium tin oxide (ITO) film, a compound film of indium oxide and tin oxide, with a thickness of 110 nm is formed by sputtering.

Further, at this point the pixel electrode 254 and the shielding film 252 overlap through the oxide 253, forming a capacitance storage 256. Note that it is desirable to set the shielding film 252 to a floating state (an electrically isolated state) or to a fixed electric potential, preferably a common electric potential (the mid-point electric potential of the image signals sent as data).

The active matrix substrate having the memory section, the driver circuit section, and the pixel section on the same substrate is thus completed. The active matrix substrate shown in FIG. 5C is the same structure as the active matrix substrate explained by FIG. 1.

With the present invention, the structure of the TFTs forming each circuit or element is optimized in response to the performance required by the memory section, the driver circuit section, and the pixel section, respectively, and the operation performance of the electro-optical device, and its reliability, can be increased. Specifically, a TFT structure which places importance on high operating speed or on hot carrier countermeasures is used in the driver circuit section, and a TFT structure which places importance on reducing the value of the off current is used in the pixel section. Further, a memory transistor is formed in the memory section while allowing only the minimum increase in number of the processing steps.

The case of an active matrix type liquid crystal display device is explained here with reference to FIG. 1.

First, a two layer gate structure TFT having the floating gate electrode 107 and the control gate electrode 108 is used as the memory transistor 301. The write in operation of the memory transistor is performed by injection of a hot carrier, generated at the junction of the channel forming region 105 and the drain region 103, into the floating gate electrode 107. On the other hand, the erasing operation is performed by an FN (Fowler-Nordheim) current flowing between the floating gate electrode 107 and the source region 102.

Further, the LDD region 104 is a buffer region to prevent an inter-band tunneling current between the source region 102 and the channel forming region 105, and is effective in increasing reliability and reducing current consumption. The length (width) of the LDD region 104 may be made between 0.1 and 2.0 μm, typically from 0.5 to 1.5 μm.

Furthermore, the n-channel TFT 302 is suitable for driver circuits such as a shift register, a level shifter, or a buffer, which places importance on high speed operation. In other words, by forming the LDD region 114 so as to overlap the gate electrode only between the channel forming region 115 and the drain region 113 while reducing resistive components as much as possible, this becomes a structure which takes measures against hot carriers.

The reason that it is sufficient to form the LDD region only in the drain region side is that, for the case of the above driver circuits, the functions of the source region and the drain region do not change, and the carrier (electron) movement direction is fixed. However, LDD regions sandwiching the channel forming region can be formed when necessary. In other words, it is possible to form the LDD regions between the source region and the channel forming region, and between the drain region and the channel forming region, respectively. Note that the length (width) of the LDD regions may be between 0.1 and 2.0 μm, preferably from 0.5 to 1.5 μm.

The pixel TFT 304 is suitable for the pixel section which places importance on low off current operation. In other words, by forming the LDD regions 128a to 128d so as not to overlap the gate electrodes 131a and 131b, low off current operation is realized. Further, by using an LDD region with an impurity concentration lower than that of the LDD regions formed in the memory section and the driver circuit section, this becomes a structure with an even lower off current value. In addition, the impurity region 130 contributes greatly to reducing the off current value.

Note that the length (width) of the LDD regions 128a and 128b formed in the pixel TFT 304 may be between 0.5 and 3.5 μm, preferably from 2.0 to 2.5 μm.

Further, by using an alumina film which has a high specific dielectric constant of 7 to 9 as the dielectric of the capacitance storage in Embodiment 1, it is possible to reduce the area occupied by the capacitance storage to form the desired capacitance. In addition, by making the shielding film formed on the pixel TFT into one electrode of the capacitance storage, as in Embodiment 1, the aperture ration of the image display section of the active matrix type liquid crystal display device can be increased.

Note that it is not necessary for the present invention to be limited to the capacitance storage structure shown in Embodiment 1 for the present invention. For example, the capacitance storage structures shown in Japanese Patent Application No. Hei 9-316567, Japanese Patent Application No. Hei 9-273444 and Japanese Patent Application No. Hei 10-254097 can be used.

Embodiment 2

Figure 6:
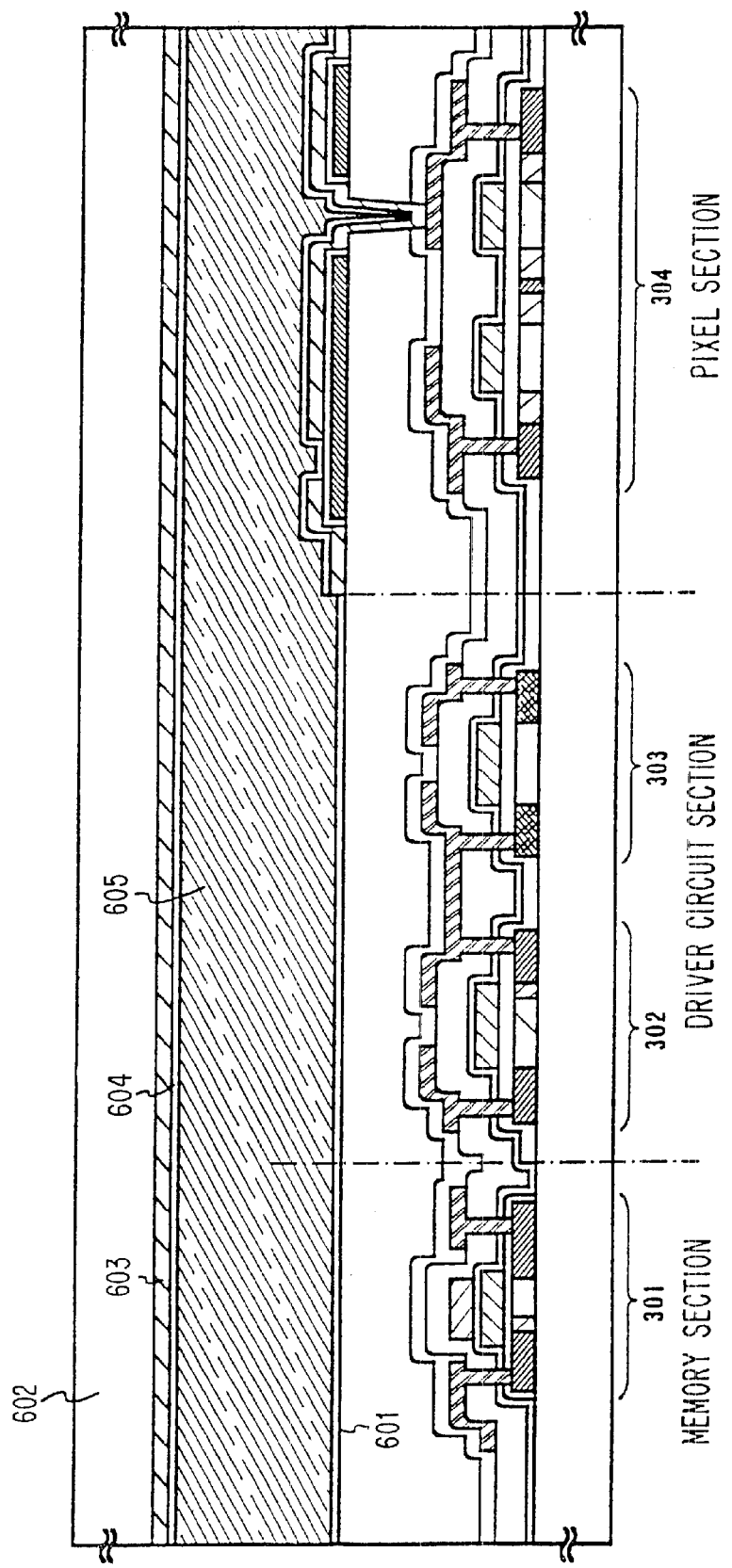
FIG. 6 is a cross sectional structural diagram of an active matrix type liquid crystal display device.

A case of manufacturing an active matrix type liquid crystal display device by performing a cell construction step on the active matrix substrate formed by Embodiment 1 (shown in FIG. 5C) is explained in embodiment 2 with reference to FIG. 6.

An orientated film 601 is formed for the substrate in the state of FIG. 5C, as shown in FIG. 6. A polyimide film is used as the alignment film in embodiment 2. Further, an opposite electrode 603 made of a transparent conductive film and an orientated film 604 are formed in an opposing substrate 602. Note that a color filter or a shielding film may be formed in the opposing substrate when necessary.

Next, after forming an orientated film, a rubbing processing is performed, regulating the orientation so that the liquid crystal molecules possess a certain fixed pre-tilt angle. The active matrix substrate, on which the pixel section and the driver circuits are formed, and the opposing substrate are then joined together by a known cell construction step using a sealing material or spacers (both not shown in the figures). A liquid crystal 605 is then injected between both substrates, and a complete seal is provided by using an end-sealing material (not shown in the figures). A known liquid crystal material may be used for the liquid crystal. The active matrix type liquid crystal display device shown in FIG. 6 is thus completed.

Figure 7:
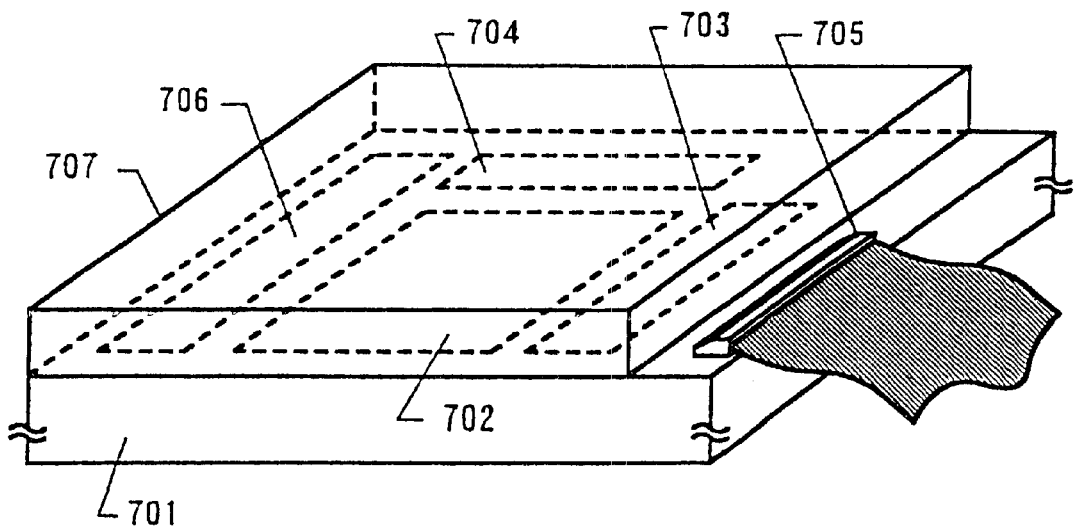
FIG. 7 is a perspective view of an active matrix type liquid crystal display device.

The structure of the active matrix type liquid crystal display device is explained using the perspective view of FIG. 7. The liquid crystal display device of the present invention has a pixel section 702, a source wiring driver circuit (image signal transmission circuit) 703, and a gate line driver circuit (scanning signal transmission circuit) 704 formed on an active matrix substrate 701. Note that reference numeral 707 denotes an opposing substrate formed opposite the active matrix substrate.

A multiple number of pixels containing the pixel TFT 304 shown in FIG. 1 are arranged in a matrix state in the pixel section 702. Further, the above pixel TFT is connected to the intersection of a source wiring extending from the source wiring driver circuit 703 and a gate wiring extending from the gate line driver circuit 704.

An FPC (flexible printed circuit) 705 is connected to the active matrix substrate 701, and a signal containing information such as an image signal and a clock signal is input to the liquid crystal display device.

In addition, a memory section 706, in which the memory transistors 301 shown in FIG. 1 are integrated, is formed in the active matrix substrate 701. The memory section 706 may be a non-volatile memory which integrates memory cells containing a selection transistor and a memory transistor in one cell. However, as the memory section 706, a flash memory in which the bit lines of a multiple number of memory transistors are made common is more suitable for high integration.

Embodiment 3

A shift register, a level shifter, a buffer, and a sampling circuit (a sample and hold circuit) are typically included in the source line driver circuit 703 in the active matrix type liquid crystal display device shown in embodiment 2. This is an example of the case of analog signal processing, and when a digital signal is processed, a latch and a D/A converter are included as a substitute for the sampling circuit. Further, a shift register, a level shifter, and a buffer are included in the gate line driver circuit.

The shift register has a driver voltage of 3.5 to 16 V (typically 5 V or 10 V), and the structure shown by reference numeral 302 in FIG. 1 is suitable for the n-channel TFT used in the CMOS circuit forming the shift register circuit. Further, the level shifter and the buffer have a high driver voltage between 14 V and 16V, and a CMOS circuit containing the n-channel TFT shown in FIG. 1 is suitable for these circuits, similar to the shift register circuit. Note that in the case of a level shifter or a buffer, making the gate electrode into a multi-gate structure such as a double gate structure or a triple, gate structure is effective in increasing the reliability of the circuit.

However, the sampling circuit contained in the source line driver circuit has a driver voltage of 14 V to 16 V, but the source region and the drain region invert, and it is necessary to reduce the value of the off current. Therefore both hot carrier and low off current value countermeasures must be devised.

Figure 8:
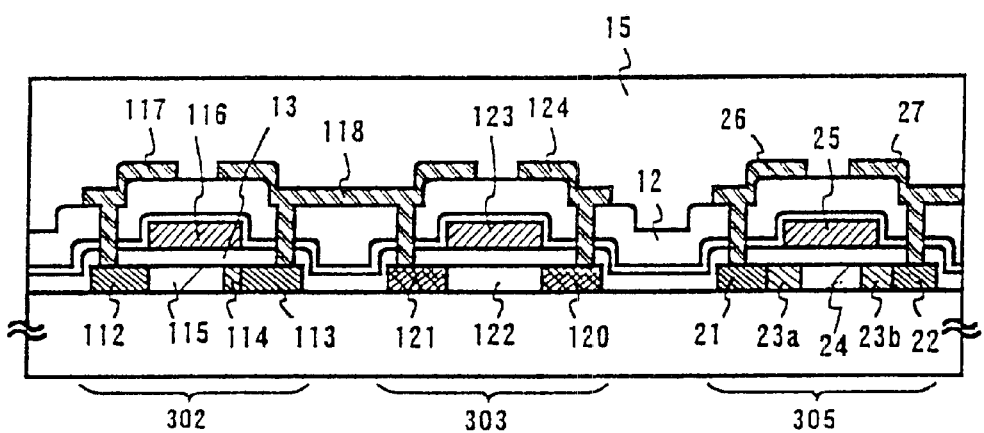
FIG. 8 is a diagram showing a driver circuit.

The structure of an n-channel TFT 305 shown in FIG. 8 is then used in Embodiment 3 as the sampling circuit. Note that although only an n-channel TFT is shown in FIG. 8, in practice it is preferable to combine an n-channel TFT and a p-channel TFT when forming the sampling circuit, making a large current easier to flow.

The structure of an n-channel TFT used in the sampling circuit has: an active layer containing a source region 21, a drain region 22, LDD regions 23*a* and 23*b*, and a channel forming region 24; a second gate insulating film 13; a gate electrode 25; a source wiring 26; and a drain wiring 27. Note that the source region and the drain region (or the source wiring and the drain wiring) invert depending upon the operation.

The most important characteristics of the n-channel TFT 305 are that the LDD regions 23*a* and 23*b* are formed sandwiching the channel forming region 24, and that the LDD regions have regions which overlap, and regions which do not overlap, the gate electrode 25 through the second gate insulating film 13.

In other words, of the LDD regions 23*a* and 23*b*, the region which overlaps the gate electrode 25 reduces deterioration due to hot carrier injection, similar to the LDD region 114 of the n-channel TFT 302 shown in FIG. 1. Further, of the LDD regions 23*a* and 23*b*, the region which does not overlap the gate electrode 25 reduces the off current value, similar to the LDD regions 128*a* to 128*d* of the pixel TFT 304 shown in FIG. 1.

By using the n-channel TFT having the above structure in a sampling circuit, deterioration due to hot carriers can be reduced, and low off current value switching operation can be performed. At this point, the length (width) of the LDD region which overlaps the gate electrode may be made between 0.3 and 3.0 $\mu$m, typically from 0.5 to 1.5 $\mu$m, and that the length (width) of the LDD region which does not overlap the gate electrode may be made between 1.0 and 3.5 $\mu$m, typically from 1.5 to 2.0 $\mu$m.

Note that the structure of the n-channel TFT 305 shown in embodiment 3 can be formed in accordance with the steps shown in FIGS. 2A to 5C without adding any special steps. Further, it is effective to use the structure of Embodiment 3 in the sampling circuit of the active matrix type liquid crystal display device shown in embodiment 2.

Embodiment 4

The active layer (especially the channel forming region) of a TFT manufactured in accordance with Embodiment 1 is formed by a crystalline silicon film having a unique crystal structure in which the crystal lattice possesses continuity. Japanese Patent Application No. Hei 10-044659, Japanese Patent Application No. Hei 10-152316, Japanese Patent Application No. Hei 10-152308, and Japanese Patent Application No. Hei 10-152305, submitted by the applicant of the present invention, may be referred to for the details relating to this type of crystalline silicon film. An explanation is made below of an outline of crystal structure characteristics investigated experimentally by the applicant of the present invention. Note that the characteristics are in agreement with the characteristics of the semiconductor film forming the active layer of a TFT completed in accordance with embodiment 4.

Looking microscopically at the above crystalline silicon film, one finds a crystal structure consisting of multiple needle shape or cylindrical shape crystals. This can easily be confirmed by observation using a TEM (transmission electron microscopy).

Further, many {110} planes can be verified on the surface of the crystalline silicon film by using electron diffraction. This can easily be verified because if an electron diffraction photograph is analyzed, a diffraction spot corresponding to the {110} plane clearly appears. Further, the diffraction spot can be verified to have a distribution (spread) of ±1° on a concentric circle.

Further, if the orientation ratio is computed using x-ray diffraction (strictly, x-ray diffraction using aθ–2θ method), it can be confirmed that the orientation ratio of the {220} plane is 0.7 or greater (typically 0.85 or greater). Note that the method disclosed in Japanese Patent Application Laid-open No. Hei 7-321339 is used for the computation of the orientation ratio.

Furthermore, if the grain boundaries formed by each of the contacting cylindrical-shape crystals are observed using an HR-TEM (high resolution transmission electron microscopy), it can be verified that the crystal lattice in the grain boundaries has continuity. This can easily be verified by the continuous connection of the observed lattice stripes in the grain boundaries.

Note that the continuity of the lattice in the grain boundaries originates in the fact that the grain boundaries are "planar shape grain boundaries". The definition of planar shape boundaries in this specification agrees with "planar boundary" in "Characterization of High-Efficiency Cast-Si Solar Cell Wafers by MBIC Measurement", Ryuichi Shimokawa and Yutaka Hayashi, Japanese Journal of Applied Physics vol. 27, no. 5, pp. 751–8, 1988.

According to the above paper, the planar boundaries includes twin crystal grain boundaries, special stacking faults, special twist grain boundaries, etc. This planar boundary possesses a characteristic in that it is not active electrically. Namely, the boundaries can essentially be seen as non-existent because they do not function as a trap that obstructs the movement of a carrier.

Particularly for cases in which the crystal axis (the axis perpendicular to the crystal plane) is the <110> axis, {211} twin crystal grain boundaries can be called grain boundaries corresponding to Σ3. The Σ value is a parameter that indicates the degree of alignment in corresponding grain boundaries, and it is known that smaller Σ values signify good grain boundary matching. For example, in the grain boundary between two crystals, for the case where both crystals have a {110} plane orientation, if the lattice stripe corresponding to the {111} plane has an angle θ, then when θ=70.5°, the grain boundaries correspond to Σ3.

In the crystalline silicon film obtained by implementing embodiment 4, if the crystal boundaries formed between two crystals with a crystal axis of <110> is observed by HR-TEM, then there are many which are continuous with an angle of approximately 70.50° between neighboring grain lattice stripes. Therefore, it can be surmised that the grain boundaries correspond to Σ3 boundaries, namely that they are {211} twin grain boundaries.

If a TEM is used to observe in detail the actual crystalline semiconductor film of embodiment 4, it can be surmised that most of the crystal grain boundaries (more than 90%, typically more than 95%) are grain boundaries corresponding to Σ3. In other words, they are {211} twin grain boundaries.

This type of crystal structure (literally, grain boundary structure) shows that two different grains are joined together with very good alignment in the grain boundaries. Namely, a crystal structure in which the crystal lattice has continuity in the grain boundaries, and in which a trap caused by crystal defects, etc. is hardly formed. Therefore it is possible to regard semiconductor thin films having this type of crystal structure as ones in which grain boundaries do not exist essentially.

In addition, it has been verified by TEM that defects within the grain boundaries almost completely disappear with a heat treatment step at a high temperature of 800 to 1150° C. It is evident that there is a large-decrease in the number of defects such as stacking faults around this heat treatment step.

The difference in the number of defects appears as the difference in spin density through electron spin resonance (ESR) analysis. At present, the crystalline silicon film in this embodiment is shown to have a spin density of at most $5 \times 10^{17}$ spins/cm$^3$ or less (preferably $3 \times 10^{17}$ spins/cm$^3$ or less). However, the measured value is near the detection limits of the present measuring equipment, and it is expected that the real spin density is even lower.

From the above, it can be considered that the crystalline silicon film formed in accordance with Embodiment 1 is a single crystal silicon film, or an essentially single crystal silicon film, because defects in grain boundaries are extremely small in number and it can be considered that grain boundaries essentially do not exist.

Embodiment 5

By placing a fixed electric potential on the electrode not connected to the pixel electrode (for the present invention, the shielding film), a capacitance storage can be formed in each pixel of the pixel section. In this case, it is preferable to set the shielding film to a floating state (an electrically isolated state) or to a common electric potential (the intermediate electric potential of the image signal sent as data).

Figure 9A:
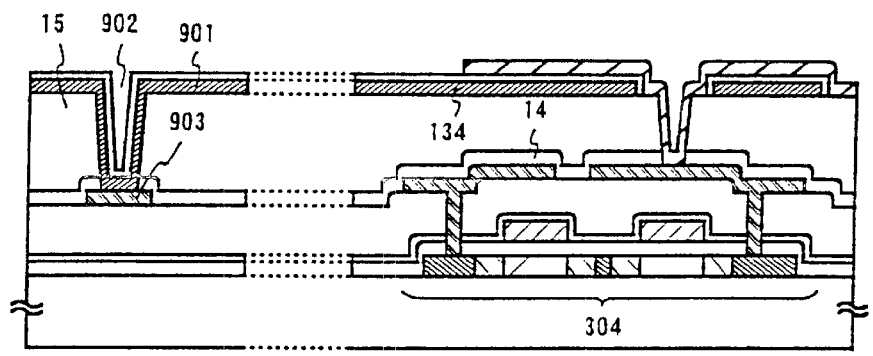
FIGS. 9A and 9B are diagrams showing a pixel section.
Figure 9B:
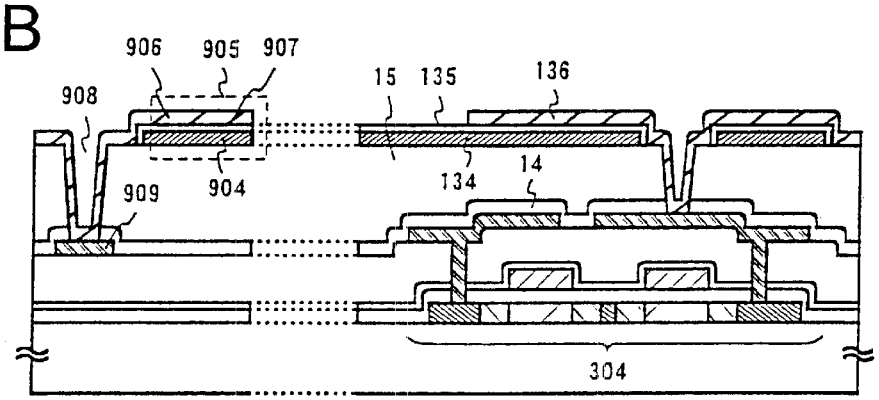

FIGS. 9A and 9B are then used in Embodiment 5 to explain a connection method for the case of setting the shielding film to a fixed electric potential. Note that the basic structure is the same as the pixel section explained by FIG. 1, and therefore this explanation is made using the same symbols in the same portions.

In FIG. 9A, reference numeral 304 denotes a pixel TFT (n-channel TFT) manufactured in a manner similar to that of Embodiment 1, and reference numeral 134 denotes a shielding film functioning as one electrode of a capacitance storage. A shielding film 901 extending to the outside of the pixel section is connected to a current supply line 903, which provides a common electric potential, through a contact hole 902 formed in the second interlayer insulating film 15 and the passivation film 14. Therefore, before forming the shielding film 901 in this case, a step of forming contact holes by etching the second interlayer insulating film 15 and the passivation film 14 is necessary. The electric current supply line 903 may be formed at the same time as the source wiring or the drain wiring.

By thus electrically connecting the shielding film 901 and the electric current supply line 903, which provides a common electric potential, outside of the pixel section, the shielding film 134 can be maintained at the common electric potential.

Next, in FIG. 9B reference numeral 304 denotes a pixel TFT manufactured in a manner similar to that of Embodiment 1, and reference numeral 134 denotes a shielding film functioning as one electrode of a capacitance storage. A shielding film 904 extending to the outside of the pixel section overlaps with a conductive film 906, through an oxide 907, in the region shown by reference numeral 905. The conductive film 906 is formed at the same time as the pixel electrode 136, and the oxide 907 is formed at the same time as the oxide 135.

The conductive film 906 is then connected to a current supply line 909, which provides a common electric potential, through a contact hole 908 formed in the second interlayer insulating film 15 and the passivation film 14. A capacitor is formed in the region 905 at this point from the shielding film 904, the oxide 907, and the conductive film 906. When the capacity of this capacitor is sufficiently large (when it is on the order of 10 times the total capacity of all the capacitance storages connected to all of the pixels in one scanning line), then the electric potential fluctuations of the shielding films 904 and 134 can be reduced by the static couple formed in the region 905.

Further, when the structure of FIG. 9B is employed, it is preferable to employ a source line inversion driving as the driving method of the active matrix type liquid crystal display device. If a source line inversion driving is used, then the polarity of the voltage applied to the pixel electrode inverts for each frame, and therefore the time averaged amount of electric charge that is accumulated in the shielding film is nearly zero In other words, a state of extremely small electric potential fluctuations can be maintained, and therefore a stable capacitance storage can be formed.

By thus employing the structure of FIG. 9B, it becomes possible to maintain the shielding film at the common electric potential without increasing the number of steps.

Note that it is possible to realize the constitution of Embodiment 5 by changing only a portion of the manufacturing steps of Embodiment 1, and that other steps may be the same as those of Embodiment 1. Therefore, it is possible to apply Embodiment 5 to the active matrix type liquid crystal display device shown in embodiment 2. Further, it is possible to freely combine the constitution of Embodiment 5 with the constitutions shown in either Embodiment 3 or Embodiment 4.

Embodiment 6

Figure 10A:
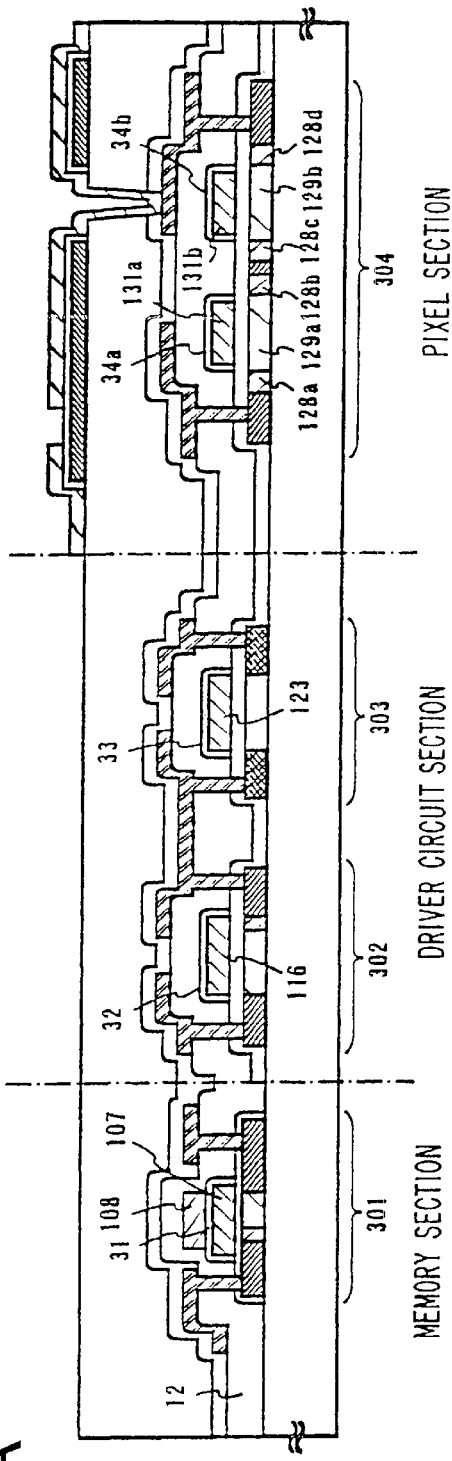
FIGS. 10A and 10B are diagrams showing the structure of a pixel section, a driver circuit, and a memory section.
Figure 10B:
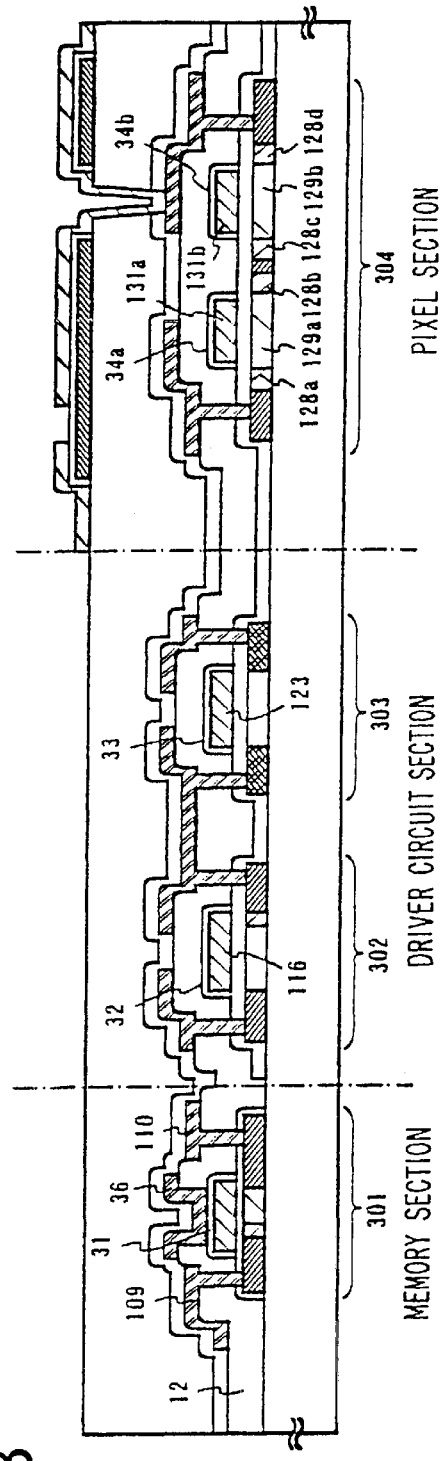

A case of manufacturing an active matrix substrate having a structure which differs from that of FIG. 1 is explained in Embodiment 6. FIGS. 10A and 10B are used in the explanation. Note that Embodiment 6 is an example of changing a portion of the structure shown in FIG. 1, and therefore the same symbols as in FIG. 1 are used in the same parts. Further, portions which are not changed correspond to those of FIG. 1, and therefore that explanation is omitted.

First, an oxide 31 is used as a third gate insulating film for the active matrix substrate shown in FIG. 10A. The oxide 31 is an oxide film obtained by oxidizing the floating gate electrode 107, and is a tantalum oxide film in Embodiment 6. Thermal oxidation, anodic oxidation, or plasma oxidation may be used as the oxidation method, but it is preferable to use thermal oxidation in order to make the film quality good. Further, the film thickness formed may be made the same as that of Embodiment 1, from 3 to 20 nm (preferably between 5 and 10 nm).

Note that oxides 32, 33, 34a and 34b are also formed at the same time on the surfaces of the respective TFT gate electrodes 116, 123, 131a, and 131b formed in the driver circuit section and in the pixel section. However, it is possible to form the oxide only on the floating gate electrode of the memory transistor by masking the driver circuit section or the pixel section and then performing oxidation step. Of course, if anodic oxidation is used, then the oxide can selectively be formed by selectively flowing an electric current only in the floating gate electrode.

Figure 11:
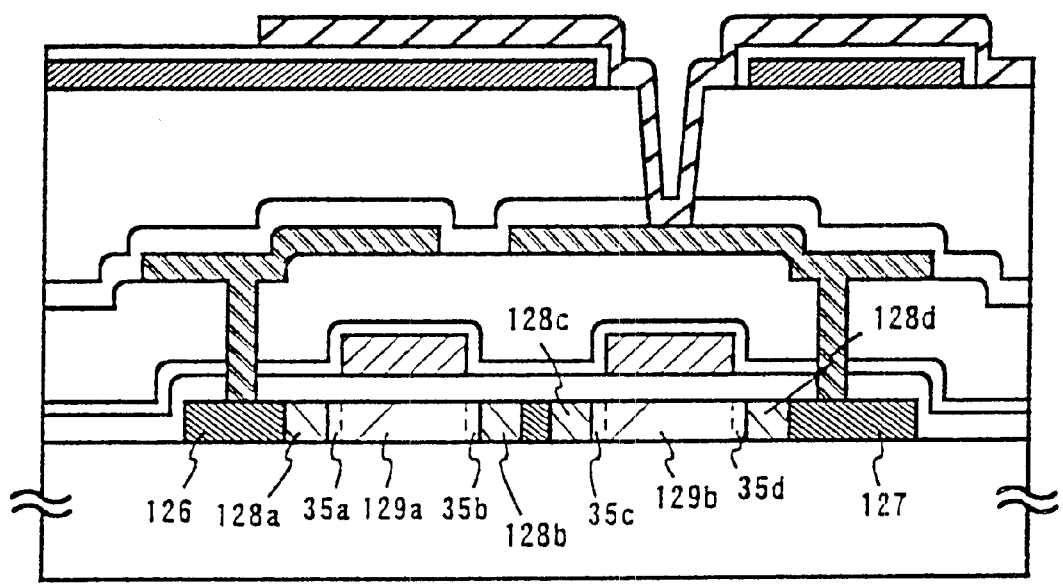
FIG. 11 is a diagram showing a pixel section.

Further, it is preferable to perform this oxidation step between the steps of FIG. 4B and the steps of FIG. 4C. This is because by performing the steps of FIG. 4C with the surfaces of the gate electrodes 131a and 131b in a state covered by the oxides 34a and 34b, offset regions 35a to 35d as shown in FIG. 11 can be formed. Note that FIG. 11 is an expanded cross sectional diagram of a portion (near the drain region) of the pixel TFT shown in FIG. 10A.

In this case, the offset regions 35a and 35b exist between the channel forming regions 129a and 129b and the LDD regions 128a to 128d formed from the n-type impurity regions (c). The length of the offset regions 35a and 35b nearly agrees with the film thickness of the oxides 34a and 34b (strictly speaking, this film thickness is the film thickness of the portion formed in the side wall of the gate electrode).

However, the length of the offset regions 35a and 35b of course becomes shorter than the film thickness of the oxides 34a and 34b due to wraparound during the doping of phosphorous.

The length of the offset regions 35a and 35b is either zero or between 1 and 200 nm (preferably from 20 to 100 nm, even better between 30 and 70 nm) for the present invention. This length can be controlled by the film thickness of the oxides 34a and 34b.

It is possible to set a pixel TFT having the structure shown in FIG. 10A to an extremely low value. Namely, when a TFT has a voltage of 14 V between the source and drain, and a gate voltage of −17.5 V, and is completely in off operation, then an of f current value of 5 pA or lower (preferably 1 pA or lower) can be achieved.

Further, the structure of FIG. 10B resembles that of FIG. 10A, but it is characterized in that a control gate electrode 36 is formed at the same time as the source wiring 109 and the drain wiring 110. This type of structure can be realized by forming openings on the top of the floating gate electrode 107 when forming contact holes for connecting the source wiring to the drain wiring (or connecting the drain wiring to the drain region).

Note that for the formation of the openings, the higher the etching selectivity with the first interlayer insulating film 12 and the third gate insulating film 31, the better.

Furthermore, offset regions 35a and 35b exist in the pixel TFT between the channel forming regions 129a and 129b and the LDD regions 128a to 128d formed from n-type impurity regions (c), similar to FIG. 10A. An explanation of the effectiveness of the offset regions has already been made for FIG. 10A, and is therefore omitted here.

Note that it is possible to implement the constitution of Embodiment 6 by simply substituting the third gate insulating film 240 deposition step in Embodiment 1 with a thermal oxidation step, an anodic oxidation step, or a plasma oxidation step. It is possible to freely combine the constitution of Embodiment 6 with the constitutions of any of embodiments 2 to 5.

Embodiment 7

Figure 12:
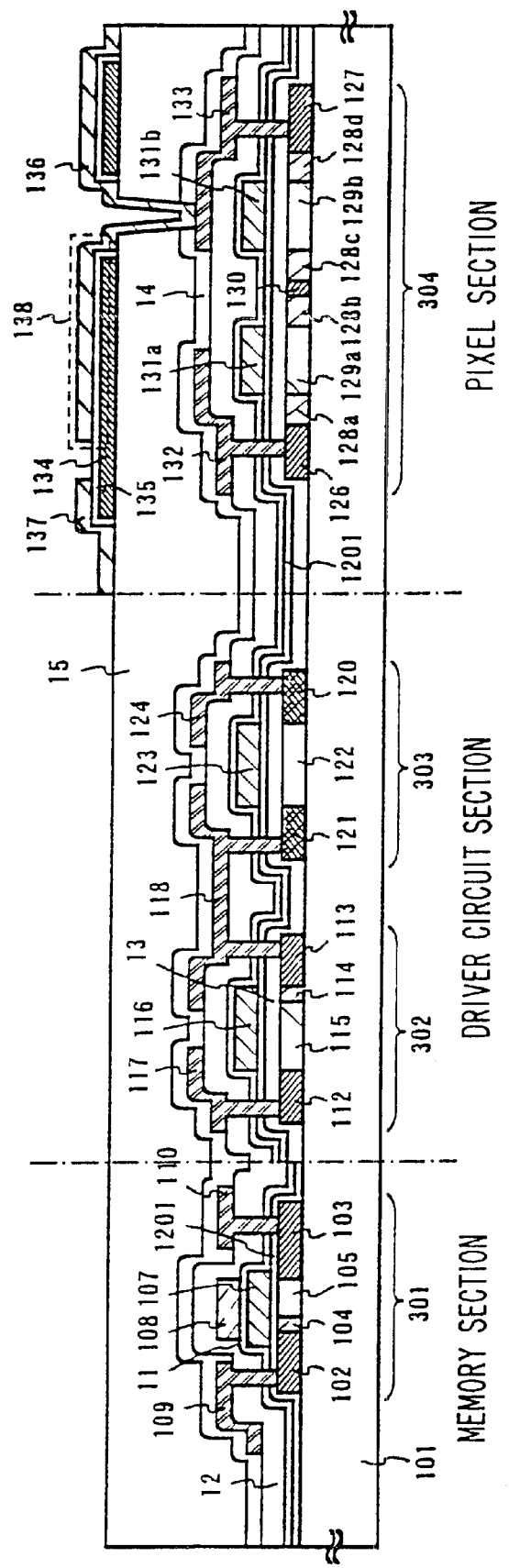
FIG. 12 is a diagram showing the structure of a pixel section, a driver circuit, and a memory section.

A case of manufacturing an active matrix substrate having a structure which differs from that of FIG. 1 is explained in Embodiment 7. FIG. 12 is used in the explanation. Note that Embodiment 7 is an example of changing a portion of the structure shown in FIG. 1, and therefore the same symbols as in FIG. 1 are used in the same parts. Further, portions which are not changed correspond to those of FIG. 1, and therefore that explanation is omitted.

An insulating film 1201 formed by low pressure thermal CVD is used as the first gate insulating film in the active matrix substrate shown in FIG. 12. In Embodiment 7, $SiH_4$ gas (flow rate $0.3 \times 10^{-6}$ m$^3$/s) and $N_2O$ gas (flow rate $1.5 \times 10^{-5}$ m$^3$/s) are used as the deposition gasses, and film deposition may be performed at a deposition temperature of 800° C. and a deposition pressure of 40 Pa. Further, the film thickness may be made the same as in Embodiment 1, from 3 to 20 nm (preferably between 5 and 10 nm). Of course, the same thermal oxidation step as in Embodiment 1 may be performed after deposition of the first gate insulating film 1201.

When implementing Embodiment 7, the laminate film of the second gate insulating film 13 and the first gate insulating film 1201 in the pixel section (also including the thermal oxide film if the above thermal oxidation step is performed) functions as a gate insulating film.

Note that, except for the addition of the first gate insulating film 1201 deposition step to Embodiment 1, there are no particular steps which must be changed, and therefore Embodiment 7 may be readily implemented with reference to Embodiment 1. Further, it is possible to implement the constitution of Embodiment 7 by freely combining it with the constitution of any of embodiments 2 to 6.

Embodiment 8

It is also possible to implement the present invention in the case where glass or plastic is used as the substrate. Of course, in this case the TFTs must be formed considering the heat resistance of the substrate made of glass or plastic.

Preferably, the semiconductor film which becomes an active layer is formed by performing crystallization of an amorphous semiconductor film by using a laser crystallization technique, or by using a solid state growth technique (thermal crystallization technique) together with the laser crystallization technique. If the laser crystallization technique is used, the crystalline semiconductor film can be formed even on a plastic substrate or a plastic film.

Further, a first gate insulating film, a second gate insulating film, and a third gate insulating film are formed by plasma CVD or sputtering. In particular, it is desirable to use ECR (electron cyclotron resonance) plasma CVD or remote plasma CVD because along with suppressing damage inflicted to the active layer, a high quality insulating film can be formed.

Note that, except for the change in the formation step of the first gate insulating film, the second insulating film, and the third insulating film in Embodiment 1, there are no particular steps which must be changed, and therefore it is possible to implement Embodiment 8 with reference to Embodiment 1. Further, it is possible to implement the constitution of Embodiment 8 by freely combining it with the constitution of any of embodiments 2 to 6.

Embodiment 9

A circuit structure of a non-volatile memory, which can form the memory section in the present invention, is explained in Embodiment 9. Specifically, an explanation is made using FIGS. 13A and 13B of the use of an NOR type flash memory as a memory section 706 in the liquid crystal display device (liquid crystal module) shown in FIG. 7. Note that only two sectors of four memory transistors connected in parallel are shown in FIGS. 13A and 13B, but it is not necessary to limit the structure to this.

Figure 13A:
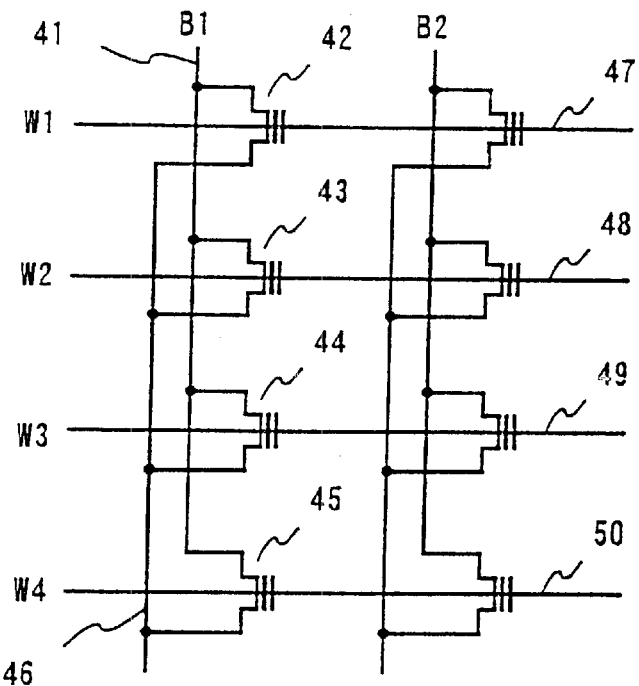
FIGS. 13A and 13B are diagrams showing the structure of a flash memory.

In FIG. 13A, four memory transistors 42 to 45 are connected to a bit wiring 41 denoted by reference numeral B1. Reference numeral B2 is similar. Further, the respective memory transistors 42 to 45 are controlled by word wirings 47 to 50, denoted by reference numerals W1 to W4, as control gate electrodes.

Note that throughout this specification, the region of the word wirings which overlaps an active layer of a TFT, in particular, is referred to as a control gate electrode. Further, although not shown in the figures, floating gate electrodes exist under the control gate electrodes in practice.

Figure 13B:
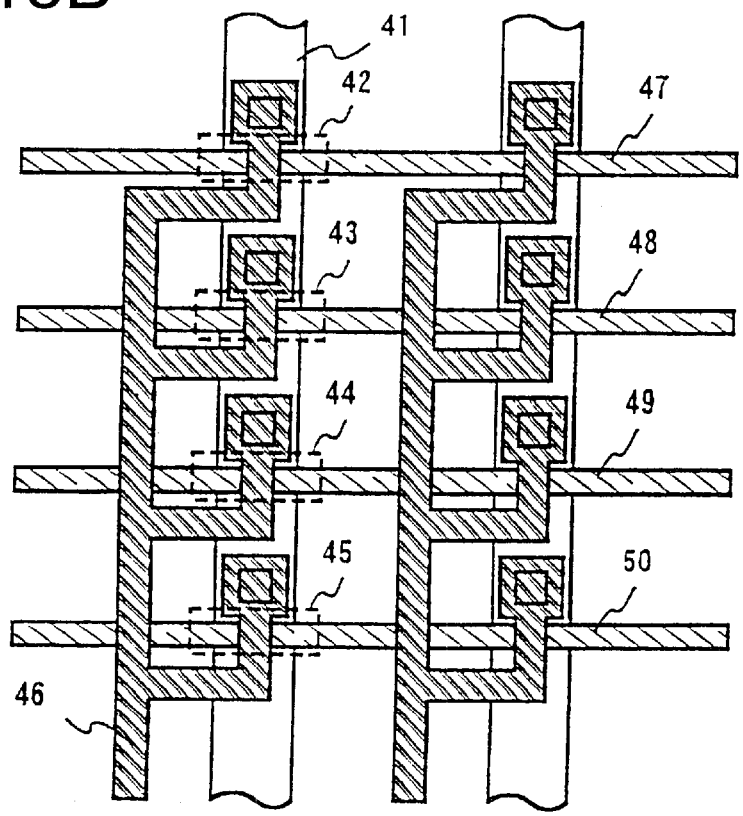

By representing the NOR type flash memory shown by the circuit diagram of FIG. 13A as an actual element pattern, it becomes as shown in FIG. 13B. Each symbol used corresponds to that of FIG. 13A.

It is possible to implement the constitution of Embodiment 9 by freely combining it with the constitution of any of embodiments 1 to 8.

Embodiment 10

A circuit structure of a non-volatile memory, which can form the memory section in the present invention, is explained in Embodiment 10. Specifically, an explanation is made using FIGS. 14A and 14B of the use of an NAND type flash memory as the memory section 706 in the liquid crystal display device (liquid crystal module) shown in FIG. 7. Note that only two sectors of eight memory transistors connected in parallel are shown in FIGS. 14A and 14B, but it is not necessary to limit the structure to this.

Figure 14A:
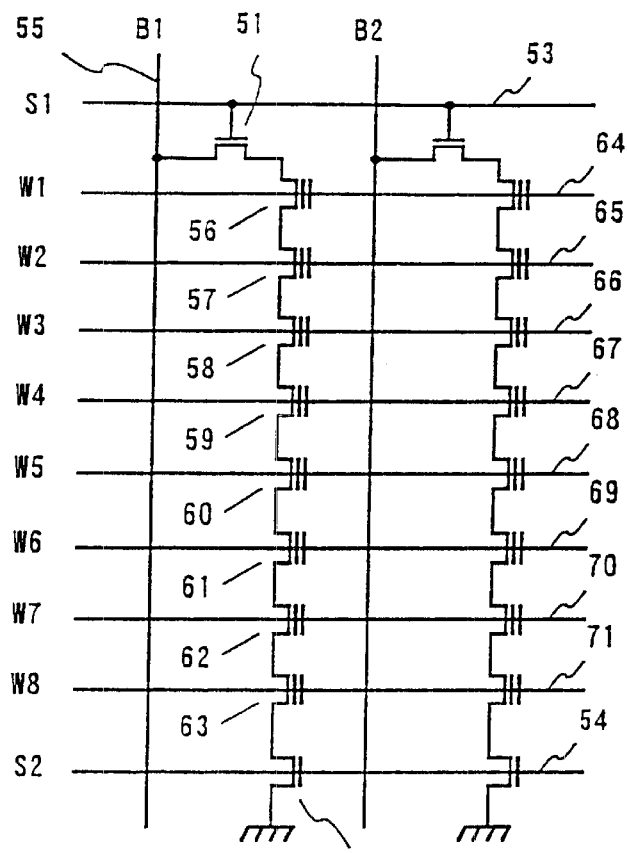
FIGS. 14A and 14B are diagrams showing the structure of a flash memory.

In FIG. 14A, two selection transistors 51 and 52, and eight memory transistors 56 to 63 are connected to a bit wiring 55 denoted by reference numeral B1. Reference numeral B2 is similar. Further, the selection transistors 51 and 52 are controlled by selection gate wirings 53 and 54, respectively, shown by reference numerals S1 and S2, and the respective memory transistors 56 to 63 are controlled by word wirings 64 to 71, denoted by reference numerals W1 to W8, as control gate electrodes.

Note that throughout this specification, the region of the word wirings which overlaps an active layer of a TFT, in particular, is referred to as a control gate electrode. Further, although not shown in the figures, floating gate electrodes exist under the control gate electrodes in practice.

Figure 14B:
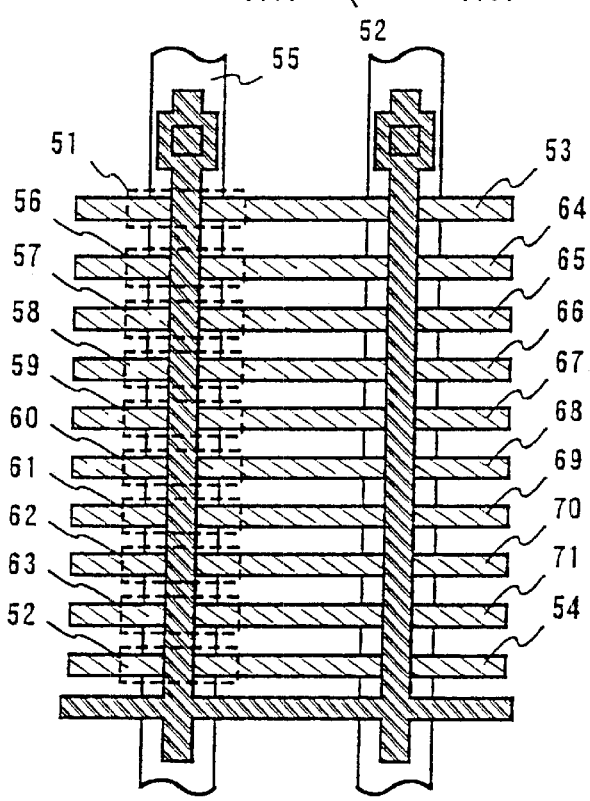

By representing the NAND type flash memory shown by the circuit diagram of FIG. 14A as an actual element pattern, it becomes as shown in FIG. 14B. Each symbol used corresponds to that of FIG. 14A.

It is possible to implement the constitution of Embodiment 10 by freely combining it with the constitution of any of embodiments 1 to 8. Furthermore, the memory section can be formed in combination with the NOR type flash memory shown in Embodiment 9.

Embodiment 11

A case of adding a $\tilde{a}$ (gamma) compensation circuit to the electro-optical device of the present invention as a signal processing circuit other than the memory section, the driver circuit section, or the pixel section, is explained in Embodiment 11.

Note that a $\gamma$ compensation circuit is a circuit which performs $\gamma$ compensation. The term $\gamma$ compensation is compensation by adding an appropriate voltage to the image signal in order to make a linear relationship between a voltage applied to a pixel electrode and the transmitted light strength of the liquid crystal or EL layer formed thereon.

Figure 15:
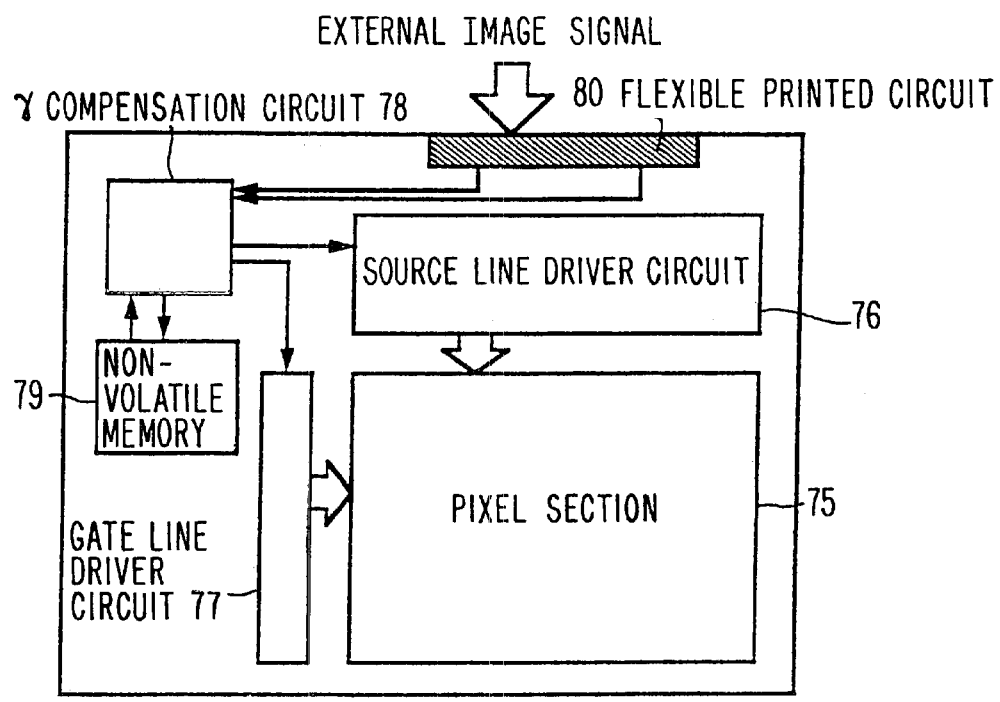
FIG. 15 is a block diagram of an active matrix substrate.

FIG. 15 is a block diagram of an active matrix substrate used in a liquid crystal display device (or in an EL display device) according to Embodiment 11. A source line driver circuit 76 and a gate line driver circuit 77 are formed in the periphery of a pixel section 75, and in addition, a γ compensation circuit 78 and a non-volatile memory (a flash memory in Embodiment 11) 79 are formed. Further, signals such as an image signal, a clock signal, and a synchronization signal are sent via an FPC (flexible printed circuit) 80.

Compensation data in order to apply γ compensation to an image signal sent from a personal computer or a television reception antenna is contained (stored) in the non-volatile memory 79, and the γ compensation circuit 78 performs γ compensation on the image signal by referencing the compensation data.

The data for γ compensation may be stored once before shipping the liquid crystal display device, but it is also possible to regularly rewrite compensation data. Further, even in liquid crystal display devices manufactured in the same way, there are cases in which the liquid crystal optical response characteristics (such as the previous relationship between transmitted light strength and applied voltage) differ subtly. It is possible to store γ compensation data which differs for each liquid crystal display device in this case as well, and it is possible to regularly obtain the same picture quality in Embodiment 11.

Note that when storing the compensation data for γ compensation in the non-volatile memory 79, it is preferable to use the means described in Japanese Patent Application No. Hei 10-156696 by the applicant of the present invention. Furthermore, an explanation related to γ compensation is contained in the above.

Further, the compensation data stored in the non-volatile memory is a digital signal, and therefore it is preferable to form a D/A converter or an A/D converter on the same substrate when necessary.

Note that it is possible to implement the constitution of Embodiment 11 by freely combining it with the constitution of any of embodiments 1 to 10.

Embodiment 12

A case of adding a memory controller circuit to the electro-optical device of the present invention as a signal processing circuit other than the memory section, the driver circuit section, or the pixel section, is explained in Embodiment 12. Note that the memory controller circuit is a controller circuit for controlling the storage and read-out operations of image data in a non-volatile memory.

Figure 16:
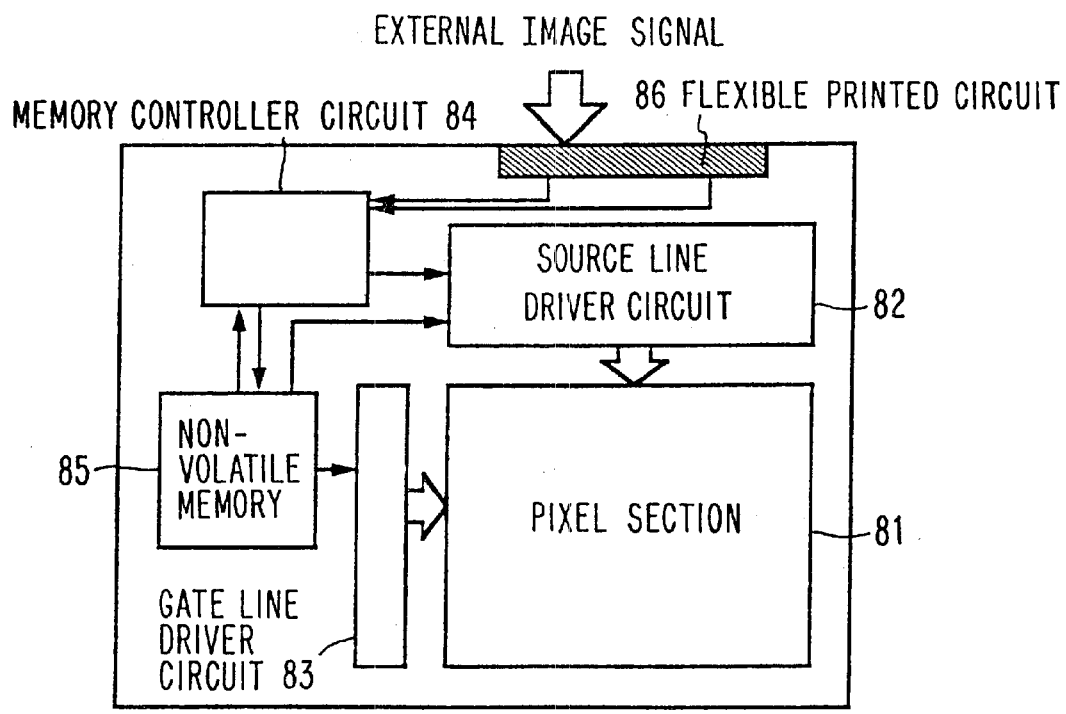
FIG. 16 is a block diagram of an active matrix substrate.

FIG. 16 is a block diagram of an active matrix substrate used in a liquid crystal display device (or in an EL display device) according to Embodiment 12. A source line driver circuit 82 and a gate line driver circuit 83 are formed in the periphery of a pixel section 81, and in addition, a memory controller circuit 84 and a non-volatile memory (a flash memory in Embodiment 12) 85 are formed. Further, signals such as an image signal, a clock signal, and a synchronization signal are sent via an FPC (flexible printed circuit) 86.

An image signal sent from a personal computer or a television reception antenna is contained (stored) per frame in the non-volatile memory 85, and this image signal is in turn inputted into the pixel section for display. Image information for one frame of an image displayed on the pixel section 81 is stored in the non-volatile memory 85. For example, when a 6-bit digital signal is sent as the image signal, it is necessary to have a memory capacity corresponding to the number of pixels times 6 bits.

Note that the image data stored in the non-volatile memory is a digital signal, and therefore it is preferable to form a D/A converter or an A/D converter on the same substrate when necessary.

By thus using the structure of Embodiment 12, the image displayed on the pixel section 81 is regularly stored in the non-volatile memory 85, and operations such as a temporary pause in the image can be easily be performed. In other words, by having the memory controller circuit 84 regularly send the image signal stored in the non-volatile memory 85 to the pixel section 81, it becomes possible to freely pause a television broadcast without recording it in a device such as a video deck.

Further, an example of the storage of 1 frame is shown in Embodiment 12, but provided that a memory capacity in the non-volatile memory 85 can be increased up to a level at which several hundred frames or several thousands of frames of image information can be stored, then it becomes possible to replay the previous several seconds or several minutes of the image.

Note that the constitution of Embodiment 12 can be implemented by freely combining it with the constitution of any of embodiments 1 to 10.

Embodiment 13

In the manufacturing process examples shown in Embodiment 1, there is a premise that the n-type impurity regions (b) are formed in advance, before forming the gate electrode of the n-channel TFT. The manufacturing process is characterized in that the p-type impurity regions (a) and the n-type impurity regions (c) are then formed in a self-aligning manner.

However, in order to obtain the effect of the present invention, the final structure should be like the structure shown in FIG. 5C, and there are no limitations placed upon steps leading up to that structure. Therefore, the impurity region formation order may be suitably changed by the operator. Further, depending upon the circumstances, it is possible to form the p-type impurity regions (a) and the n-type impurity regions (c) by using a resist mask. In other words, as shown in FIG. 5C, so long as the final TFTs have structures which differ according to each circuit, any process order combination may be employed.

Embodiment 14

It is possible to use the present invention in forming an interlayer insulating film on a conventional MOSFET and then forming a TFT on top of that. In other words, it is possible to realize a semiconductor device with a three-dimensional structure.

Further, it is possible to use an SOI substrate such as SIMOX, Smart-Cut (a registered trademark of SOITEC Corporation), or ELTRAN (a registered trademark of Canon, Inc.) as the substrate. In addition, it is possible to use the single crystalline semiconductor thin film as an active layer.

Note that it is possible to freely combine the constitution of Embodiment 14 with the constitution of any of embodiments 1 to 13.

Embodiment 15

It is possible to use various types of liquid crystal materials in a liquid crystal display device manufactured in accordance with the present invention. The following can be given as examples of the above liquid crystal material: a TN liquid crystal; PDLC (polymer dispersion liquid crystal); FLC (ferroelectric liquid crystal); AFLC (an antiferroelectric liquid crystal); and a mixture of FLC and AFLC (an antiferroelectric combination liquid crystal).

For example, it is possible to use the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; Yoshida, T., et al., "A Full-color Thresholdless Antiferroelectric LCD Exhibiting Wide Viewing Angle with Fast Response Time," SID Digest, 841, 1997; Inul, S., et al., "Thresholdless antiferroelectricity in liquid crystals and its application to displays," J. Mater. Chem., 6(4), pp. 671–3, 1996; and U.S. Pat. No. 5,594,569.

In particular, among thresholdless antiferroelectric liquid crystals (abbreviated as TL-AFLC) that show electro-optical response characteristics in which the transmissivity changes continuously with the electric field, there are TL-AFLCs which show V-shape (or U-shape) electro-optical response characteristics, and those which have a driver voltage on the order of ±2.5 V (a cell thickness of approximately 1 to 2 μm) stand out. Therefore, there are cases when the power supply voltage used by the pixel circuit is in the range of 5 to 8 V, and this suggests that it is possible to operate the control circuits and the pixel circuit by the same power supply voltage. In other words, the entire liquid crystal display device can attain low power consumption.

Further, ferroelectric liquid crystals and anti-ferroelectric liquid crystals possess the advantage of a fast response speed compared to TN liquid crystals. Extremely high speed operation TFTs are realized for the TFTs used by the present invention, and therefore it is possible to realize a liquid crystal display device with a fast image response speed which sufficiently makes use of the fast response speed of the ferroelectric liquid crystals and the anti-ferroelectric liquid crystals.

Furthermore, the spontaneous polarization of a thresholdless antiferroelectric mixed liquid crystal is large, in general, and the dielectric constant of the liquid crystal itself is high. Thus, a relatively large capacitance storage is necessary for the pixels when a thresholdless antiferroelectric mixed liquid crystal is used for a liquid crystal display device. Therefore it is desirable to use a thresholdless antiferroelectric mixed liquid crystal that has a small spontaneous polarization. For that reason, the capacitance storage shown by FIG. 1 of Embodiment 1 can store a large capacity by a small surface area, and this is preferable.

Note that it is, of course, effective to use the liquid crystal display device of Embodiment 15 as a display for electronic equipment such as a personal computer.

Further, it is possible to freely combine the constitution of Embodiment 15 with the constitution of any of embodiments 1 to 14.

Embodiment 16

It is possible to apply the present invention to an active matrix type EL (electroluminescence) display (also referred to as an EL display device). An example of this is shown in FIG. 17.

Figure 17:
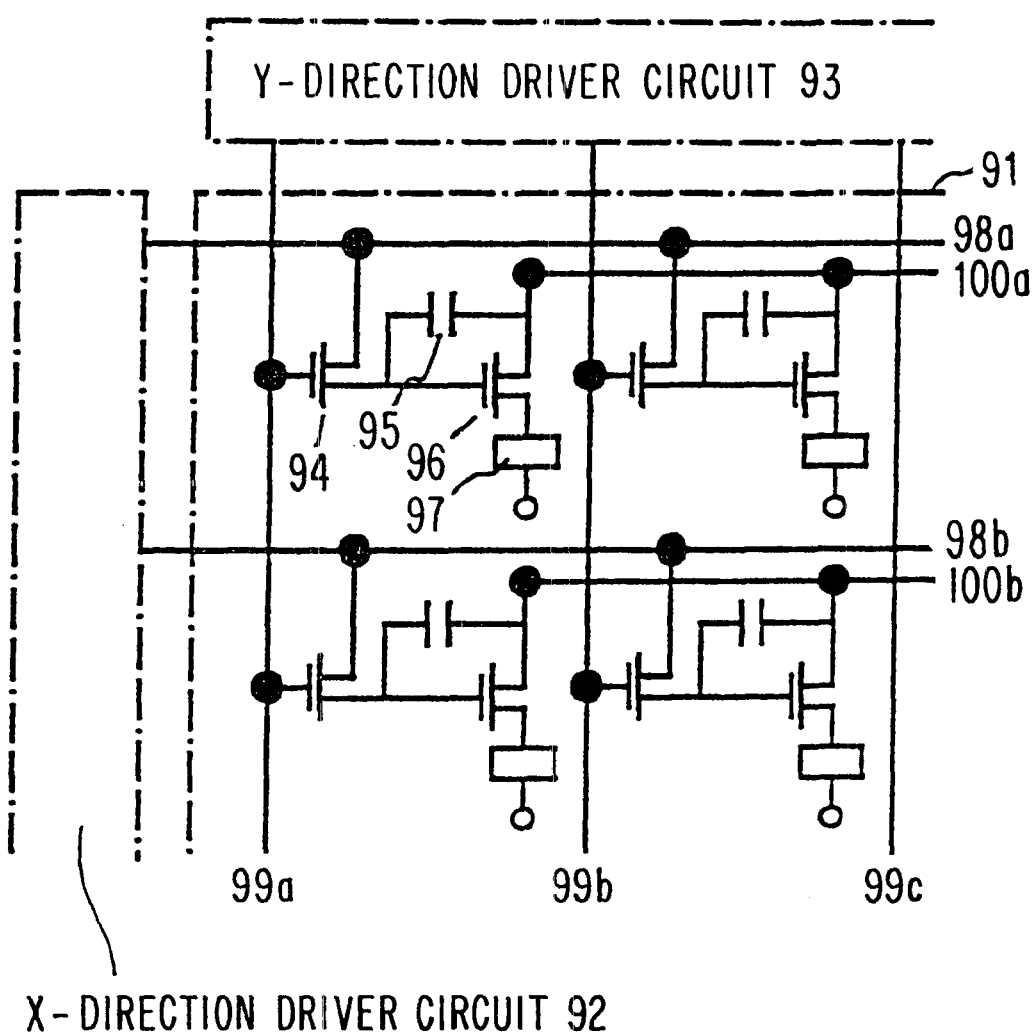
FIG. 17 is a diagram showing the structure of an active matrix type EL display device.

FIG. 17 is a circuit diagram of the active matrix type EL display of Embodiment 16. Reference numeral 91 denotes a display region, and an x-direction (source side) driver circuit 92 and a y-direction (gate side) driver circuit 93 are formed in the periphery of the display region. Further, each pixel of the display region 91 has a switching TFT 94, a capacitor 95, a current control TFT 96, and an EL element 97. An x-direction signal line (source signal line) 98a (or 98b), and a y-direction signal line (gate signal line) 99a (or 99b or 99c) are connected to the switching TFT 94. Further, power source lines 100a and 100b are connected to the current control TFT 96.

Note that the constitution of any of embodiments 1, 4, and 6 to 13 may be used for the active matrix type EL display of Embodiment 16.

Embodiment 17

An explanation of the example manufacture of an active matrix type EL (electro-luminescence) display device using the present invention is given in Embodiment 17. Note that FIG. 18A is a top view, and that FIG. 18B is a cross sectional diagram, of the EL display device of Embodiment 17.

Figure 18A:
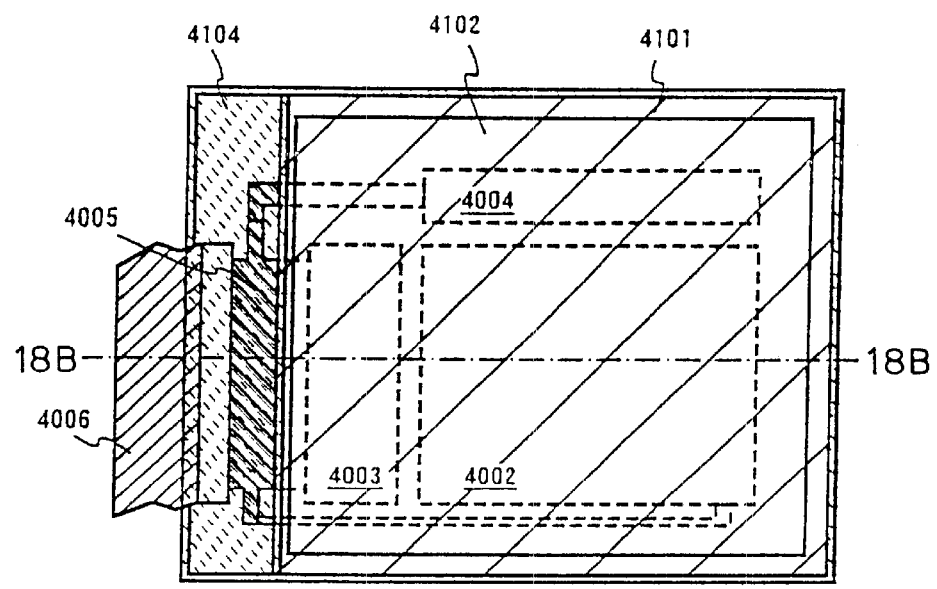
FIGS. 18A and 18B are diagrams showing the top surface structure and the cross sectional structure, respectively, of an EL display device.

In FIG. 18A reference numeral 4001 denotes a substrate, 4002 denotes a pixel section, 4003 denotes a source side driver circuit, and 4004 denotes a gate side driver circuit. Both driver circuits lead to an FPC (flexible printed circuit) 4006 through a wiring 4005, and thus connected to external equipment.

A first sealing material 4101, a cover material 4102, a filler material 4103, and a second sealing material 4104 are formed so as to surround the pixel section 4002, the source side driver circuit 4003, and the gate side driver circuit 4004.

Figure 18B:
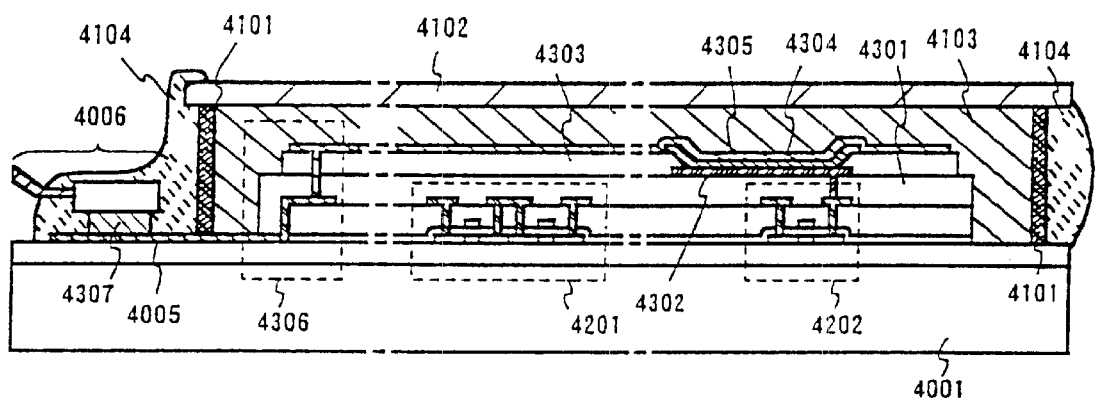

Further, FIG. 18B corresponds to a cross section of FIG. 18A taken along the line A–A', and a driver TFT (an n-channel TFT and a p-channel TFT are shown in the figures here, however) 4201 included in the source side driver circuit 4003, and a current control TFT (a TFT for controlling the electrical current to an EL element) 4202 included in the pixel section 4002 are formed on the substrate 4001.

In Embodiment 17, TFTs with the same structures as those of the n-channel TFT 302 and the p-channel TFT 303 of FIG. 1 are used in the driver TFT 4201, and a TFT with the same structure as the p-channel TFT 303 of FIG. 1 is used in the current control TFT 4202. Further, a memory section is formed on the same substrate, and a TFT with the same structure as the memory transistor 301 of FIG. 1 is used. In addition, a capacitance storage (not shown in the figures) connected to the gate of the current control TFT 4202 is formed in the pixel section 4002.

An interlayer insulating film (leveling film) 4301 is formed from a resin material on the driver TFT 4201 and the pixel TFT 4202, and a pixel electrode (anode) 4302 electrically connected to the drain of the pixel TFT 4202 is formed on the interlayer insulating film 4301. A transparent conductive film with a large work function is used as the pixel electrode 4302. An indium oxide and tin oxide compound, or an indium oxide and zinc oxide compound can be used as the transparent conductive film.

An insulating film 4303 is then formed on the pixel electrode 4302, and an opening is formed in the insulating film 4303 over the pixel electrode 4302. An EL (electroluminescence) layer 4304 is formed on the pixel electrode 4302 in the opening. The EL layer 4304 can be formed by a known organic EL material or a known inorganic EL material. Further, the known organic EL material falls into low molecular weight type (monomer type) materials and high molecular weight type (polymer) materials exist, and either may be used.

A known evaporation technique or application technique may be used as a formation method of the EL layer 4304. Further, the EL layer structure may be a single layer structure, or a freely combined laminate structure, of the following: a hole injection layer, a hole transport layer, an illumination layer, an electron transport layer, or an electron injection layer.

A cathode 4305 is then formed on the EL layer 4304 from a conductive film having light shielding properties (typically a conductive film with aluminum, copper, or silver as its principal constituent, or a laminate film of one of these and another conductive film). Furthermore, it is preferable to remove as much as possible the moisture and oxygen which exists in the boundary of the cathode 4305 and the EL layer 4304. Therefore, it is necessary to deposit both in succession in a vacuum, or to form the EL layer 4304 in a nitrogen or noble gas atmosphere, and then form the cathode 4305 without exposure to oxygen or moisture. The above type of film deposition is possible in Embodiment 17 by using a multi-chamber type (cluster tool type) deposition device.

The cathode 4305 is then electrically connected to the wiring 4005 in the region denoted by reference numeral 4306. The wiring 4005 is a wiring for providing a predetermined voltage to the cathode 4305, and is electrically connected to the FPC 4006 through an oriented conductive film 4307.

The EL element is thus formed from the pixel electrode (anode) 4302, the EL layer 4304, and the cathode 4305. The EL element is surrounded by the first sealing material 4101 and the cover material 4102 which is joined to the substrate 4001 by the first sealing material 4101, and is enclosed by the filler material 4103.

A glass material, a metallic material (typically stainless steel), a ceramic material, and a plastic material (including a plastic film) can be used as the covering material 4102. An FRP (fiberglass-reinforced plastic) plate, a PVF (polyvinyl fluoride) film, a Mylar film, a polyester film, or an acrylic resin film can be used as the plastic material. Further, a sheet with a structure of aluminum foil sandwiched by a PVF film or a Mylar film can also be used.

However, when the light radiation direction from the EL element is toward the covering material side, then the covering material must be transparent. In that case, a transparent substance such as a glass plate, a plastic plate, a polyester film, or an acrylic film is used.

Furthermore, an ultraviolet light hardened resin or a thermally hardened resin can be used as the filler material 4103, and PVC (polyvinyl chloride), acrylic, polyimide, epoxy resin, silicone resin, PVB (polyvinyl butyral), and EVA (ethylene vinyl acetate can be used. If a moisture absorbent substance (preferably barium oxide) is formed in the inside of the filler material 4103, then deterioration of the EL element can be suppressed.

Further, spacers may be included within the filler material 4103. If the spacers are formed by barium oxide, then it is possible to give moisture absorbency to the spacers themselves. Further, when forming spacers, it is effective to form a resin film on the cathode 4305 as a buffer layer relieving pressure from the spacers.

The wiring 4005 is electrically connected to the FPC 4006 through the oriented conductive film 4307. The wiring 4005 transmits the signals once sent to the pixel section 4002, the source side driver circuit 4003, and the gate side driver circuit 4004, to the FPC 4006, and is electrically connected with external equipment by the FPC 4006.

Further, in Embodiment 17 the second sealing material 4104 is formed so as to cover the exposed portion of the first sealing material 4101 and a portion of the FPC 4006, and this becomes a structure in which the EL element is thoroughly shielded from the atmosphere. An EL display device having the cross sectional structure of FIG. 18B is thus obtained. Note that the EL display device of Embodiment 17 may be manufactured by combining the constitutions of any of embodiments 1, 4, 6 to 13, and 16.

Figure 19:
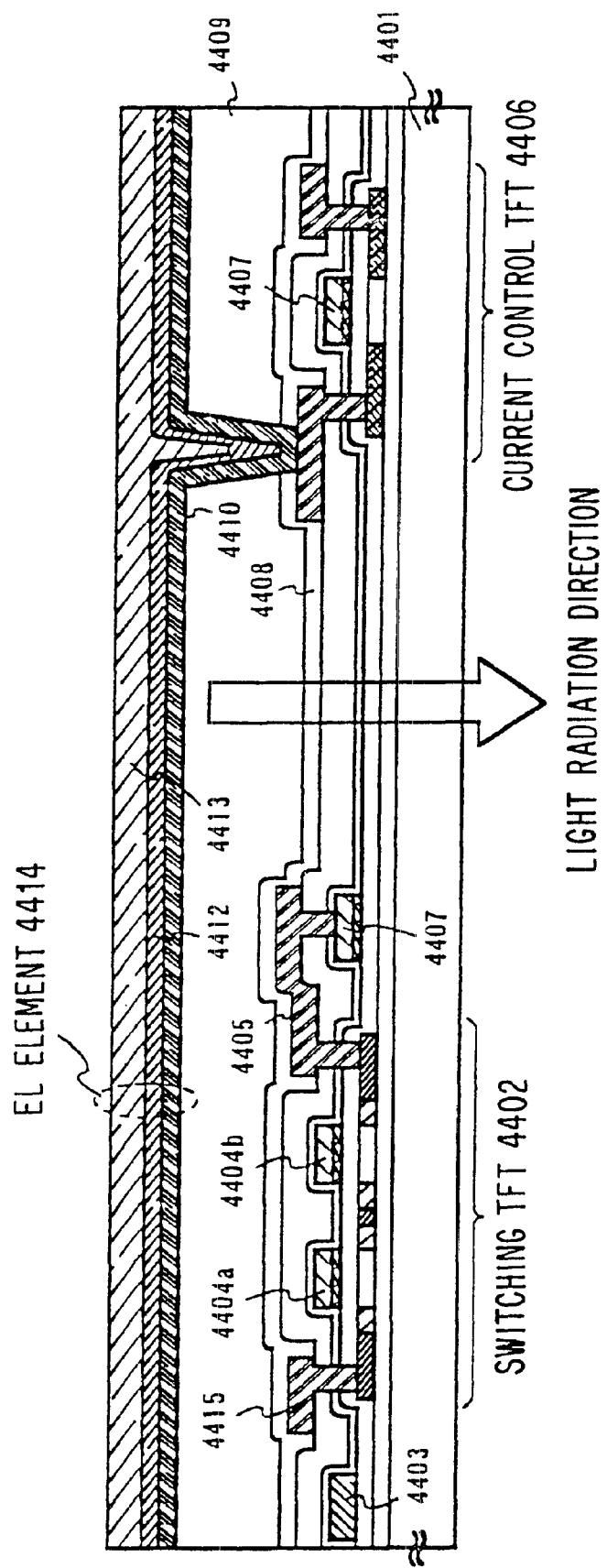
FIG. 19 is a diagram showing the cross sectional structure of an EL display device.
Figure 20A:
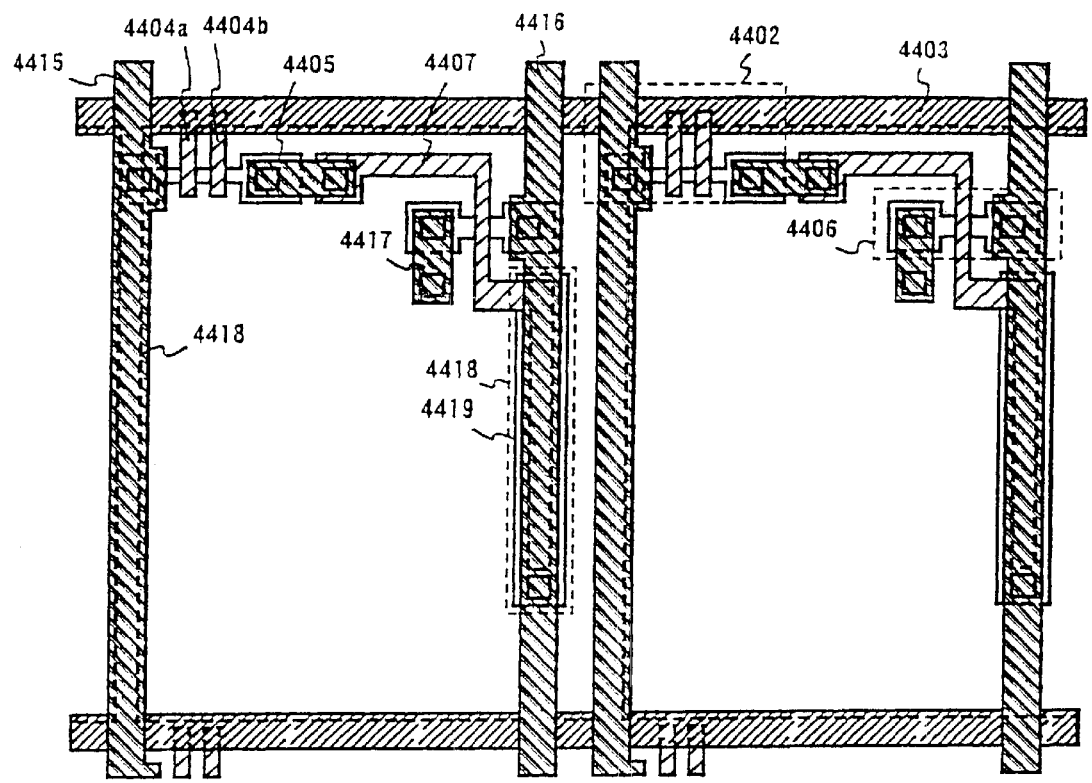
FIGS. 20A and 20B are diagrams showing the top surface structure of a pixel section of an EL display device.
Figure 20B:
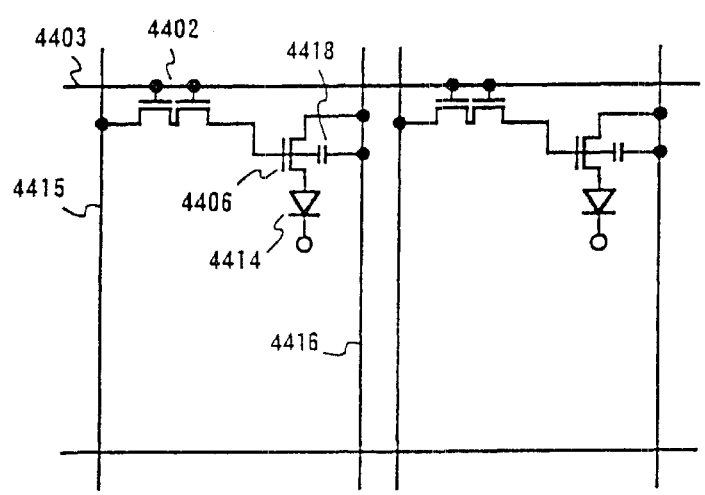

A more detailed cross sectional structure of the pixel section is shown here in FIG. 19, and a top structure is shown in FIG. 20A, while a circuit diagram is shown in FIG. 20B. Common symbols are used in FIG. 19, FIG. 20A, and FIG. 20B, and therefore the figures may be referenced together.

In FIG. 19, a switching TFT 4402 formed on the substrate 4401 is formed using the n-channel TFT 304 formed in the pixel section of FIG. 1. Therefore, the explanation of the n-channel TFT 304 may be referenced for an explanation of the structure of the switching TFT 4402. Further, a wiring denoted by reference numeral 4403 is a gate wiring for electrically connecting gate electrodes 4404a and 4404b of the switching TFT 4402.

Note that a double gate structure, in which two channel forming regions are formed, is used in Embodiment 17, but a single gate structure having one channel forming region formed, or a triple gate structure in which three are formed may also be used.

Furthermore, a drain wiring 4405 of the switching TFT 4402 is electrically connected to the gate electrode 4407 of a current control TFT 4406. Note that the current control TFT 4406 is formed using the p-channel TFT 303 of FIG. 1. Therefore, the explanation of the p-channel TFT 303 may be referenced for an explanation of the structure of the current control TFT 4406. Note that although a single gate structure is used in Embodiment 17, a double gate structure or a triple gate structure may also be used.

A first passivation film 4408 is formed on the switching TFT 4402 and the current control TFT 4406, and a leveling film 4409 is formed on the passivation film 4408 from a resin. It is extremely important to level step changes in the TFTs by using the leveling film 4409. An EL layer which is formed later is extremely thin, and therefore there are cases of poor luminescence due to the existence of a step. Consequently, it is preferable to perform leveling before forming a pixel electrode so that the EL layer can be formed on as level a surface as possible.

Reference numeral 4410 denotes a pixel electrode (EL element anode) made from a transparent conductive film, and the pixel electrode is electrically connected to a drain wiring 4410 of the current control TFT 4406. A conductive film made from a material such as an indium oxide and tin oxide compound, or an indium oxide and zinc oxide compound, can be used as the pixel electrode 4410.

An EL layer 4412 is formed on the pixel electrode 4410. Note that although only one pixel is shown in FIG. 19, in Embodiment 17 the EL layer is divided to correspond to the colors R (red), G (green), and B (blue). Further, a low molecular weight organic EL material is formed by an evaporation method in Embodiment 17. Specifically, it is a laminate structure of a 20 nm thick copper phthalocyanine (CuPc) film formed as a hole injection layer, and a 70 nm thick tris-8-quinolinolate aluminum complex ($Alq_3$) film formed on top as a luminescence layer. By doping a fluorescent pigment into $Alq_3$, the color of light emitted can be controlled.

However, the above example is one example of an organic EL material which can be used as the EL layer, and it is not necessary to place any limitations on this. An EL layer (a layer for performing luminescence and carrier movement for luminescence) may also be formed by freely combining a luminescence layer, a charge carrier layer, and a charge injection layer. For example, the example shown in Embodiment 17 is one using a low molecular weight organic EL material as the EL layer in Embodiment 17, but a high molecular weight EL material may also be used. Further, it is possible to use an inorganic material such as silicon carbide as a charge carrier layer or a charge injection layer. Known materials can be used as these organic EL materials and inorganic EL materials.

A cathode 4413 is formed next on the EL layer 4412 from a conductive film having light shielding characteristics. In Embodiment 17, an alloy film of aluminum and lithium is used as the light shielding conductive film. Of course, a known MgAg film (an alloy film of magnesium and silver) may also be used. A conductive film made from an element residing in periodic table group 1 or group 2, or a conductive film doped with a group 1 or group 2 element, may be used as the cathode material.

An EL element 4414 is thus completed at the point where the cathode 4413 is formed. Note that the EL element 4414 used here specifies a capacitor formed by the pixel electrode (anode) 4410, the EL layer 4412, and the cathode 4413.

An explanation of the top structure of the pixel in Embodiment 17 is made next using FIG. 20A. The switching TFT 4402 source is connected to a source wiring 4415, and its drain is connected to the drain wiring 4405. Further, the drain wiring 4405 is electrically connected to the gate electrode 4407 of the current control TFT 4406. In addition, the source of the current control TFT 4406 is electrically connected to an electric current supply line 4416, and its drain is electrically connected to a drain wiring 4417. The drain wiring 4417 is electrically connected to a pixel electrode (anode) 4418 shown by a dotted line.

A capacitance storage is formed at this point in the region shown by reference numeral 4419. A capacitance storage 4419 is formed between a semiconductor film 4420 which is electrically connected to the electric current supply line 4416, an insulating film (not shown in the figures) on the same layer as the gate insulating film, and the gate electrode 4407. Furthermore, it is possible to use a capacitance formed by the gate electrode 4407, an insulating film (not shown in the figures) on the same layer as the first interlayer insulating film, and the electric current supply line 4416 as a capacitance storage.

Note that it is possible to implement the constitution of Embodiment 17 by freely combining it with the constitution of any of embodiments 1, 4, 6 to 13, and 16.

Embodiment 18

Figure 21:
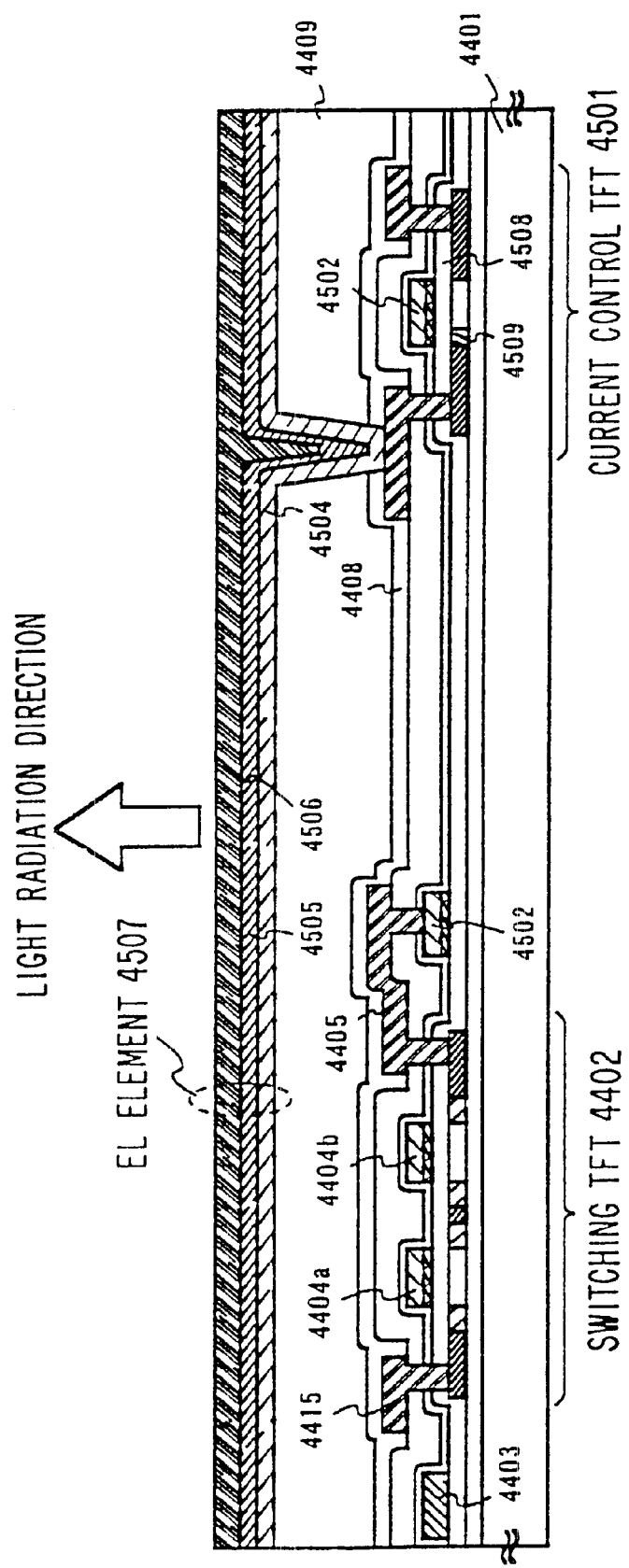
FIG. 21 is a diagram showing the cross sectional structure of an EL device.

An EL display device having a pixel structure which differs from that of Embodiment 17 is explained in Embodiment 18. FIG. 21 is used in the explanation. Note that Embodiment 17 may be referred to for an explanation of sections having symbols which are the same as those of FIG. 19.

A TFT with the same structure as the n-channel TFT 302 of FIG. 1 is used as a current control TFT 4501 in FIG. 21. A gate electrode 4502 of the current control TFT 4501 is of course connected to the drain wiring 4405 of the switching TFT 4402. Further, a drain wiring 4503 of the current control TFT 4501 is electrically connected to a pixel electrode 4504.

If the voltage applied to an EL element becomes 10 V or greater, then the deterioration due to the hot carrier effect becomes conspicuous, and therefore it is effective to use a TFT having the same structure as the n-channel TFT 302 of FIG. 1 as the current control TFT 4501. Further, provided that the voltage applied to the EL element is 10 V or less, then deterioration due to the hot carrier effect does not become much of a problem, and therefore a TFT with a structure in which the LDD region 114 is omitted from the n-channel TFT 302 may be used.

In Embodiment 18, the pixel electrode 4504 function as a cathode of the EL element, and is formed using a conductive film having light shielding characteristics. Specifically, an alloy film of aluminum and lithium is used, but a conductive film made from an element residing in periodic table group 1 or group 2, or a conductive film doped with a group 1 or group 2 element, may also be used.

An EL layer 4505 is formed on the pixel electrode 4504. Note that only one pixel is shown in FIG. 21, and in Embodiment 18 an EL layer corresponding to G (green) is formed by an evaporation method or an application method (preferably a spin coating method). Specifically, a laminate structure of a 20 nm thick lithium fluoride (LiF) film formed as an electron injection layer, and a 70 nm thick PPV (polyparaphelene vinyl) film formed on top as a luminescence layer, is used.

An anode 4506 made of a transparent conductive film is formed next on the EL layer 4505. A conductive film made from a compound such as an indium oxide and tin oxide compound, or an indium oxide and zinc oxide compound, is used in Embodiment 18.

An EL element 4507 is thus completed at the point where the anode 4506 is formed. Note that the EL element 4507 used here specifies a capacitor formed by the pixel electrode (cathode) 4504, the EL layer 4505, and the anode 4506.

Note that the current control TFT 4501 of Embodiment 18 is so constructed that a parasitic capacity called a gate capacitor is formed between the gate electrode 4502, and LDD regions 4509a and 4509b. By regulating the gate capacitor, it is possible to give it the same function as the capacitance storage 4418 shown in FIGS. 20A and 20B. In particular, when the EL display device is operated in a digital driving manner, the capacitance of the capacitance storage is smaller than when the EL display device is operated in an analog driving manner, and therefore the capacitance storage can be substituted by the gate capacitor.

Note that it is possible to implement the constitution of Embodiment 18 by freely combining it with the constitution of any of embodiments 1, 4, 6 to 13, and 16.

Embodiment 19

Figure 22A:
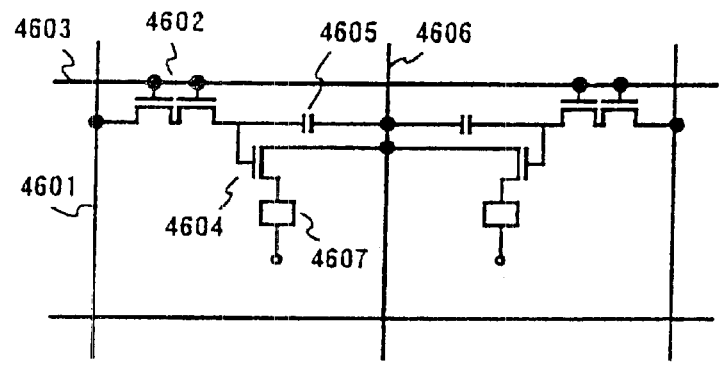
FIGS. 22A to 22C are diagrams showing the circuit structure of a pixel section of an EL display device.
Figure 22B:
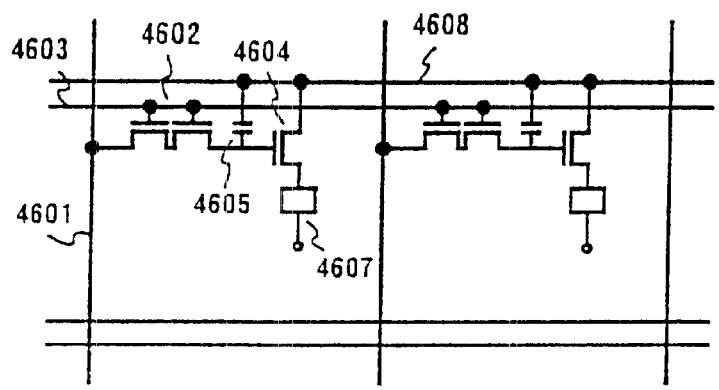
Figure 22C:
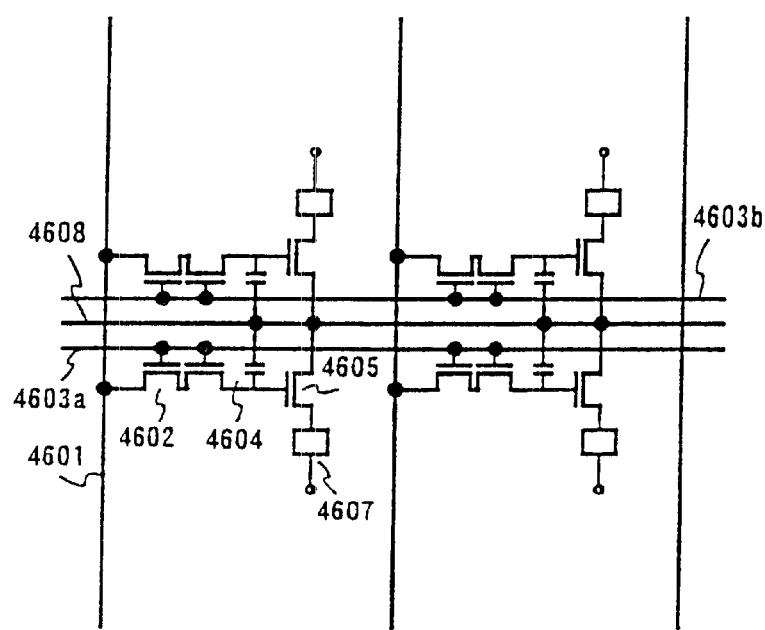

In Embodiment 19, examples of the pixel structure of the EL display device shown in Embodiment 17 or Embodiment 18 are shown in FIGS. 22A to 22C. Note that in Embodiment 19, reference numeral 4601 denotes a source wiring of a switching TFT 4602, reference numeral 4603 denotes a gate wiring of the switching TFT 4602, reference numeral 4604 denotes a current control TFT, 4605 denotes a capacitor, 4606 and 4608 denote electric current supply lines, and 4607 denotes an EL element.

FIG. 22A is an example of a case in which the electric current supply line 4606 is common between two pixels. Namely, this is characterized in that the two pixels are formed having linear symmetry around the electric current supply line 4606. In this case, the number of electric current supply lines can be reduced, and therefore the pixel section can be made even more high definition.

Further, FIG. 22B is an example of a case in which the electric current supply line 4608 is formed parallel to the gate wiring 4603. Note that in FIG. 22B, the structure is formed such that the electric current supply line 4608 and the gate wiring 4603 do not overlap, but provided that both are wirings formed on different layers, then they can be formed to overlap through an insulating film. In this case, the exclusive surface area of the electric current supply line 4608 and the gate wiring 4603 can be shared, and the pixel section can be made even more high definition.

Furthermore, FIG. 22C is characterized in that the electric current supply line 4608 and the gate wiring 4603 are formed in parallel, similar to the structure of FIG. 22B, and additionally, in that the two pixels are formed so as to have linear symmetry around the electric current supply line 4608. In addition, it is effective to form the electric current supply line 4608 so as to overlap with one of the gate wirings 4603. In this case, the number of electric current supply lines can be reduced, and therefore the pixel section can be made even more high definition.

Embodiment 20

Figure 23A:
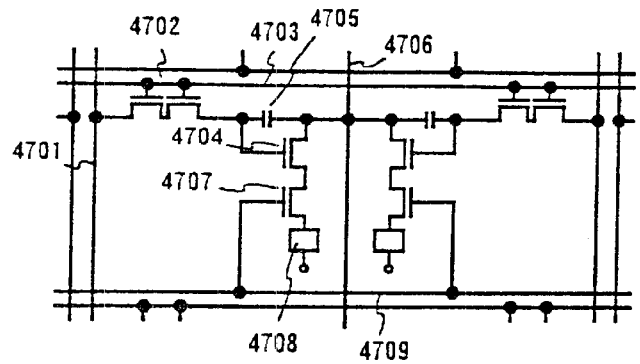
FIGS. 23A and 23B are diagrams showing the circuit structure of a pixel section of an EL display device.
Figure 23B:
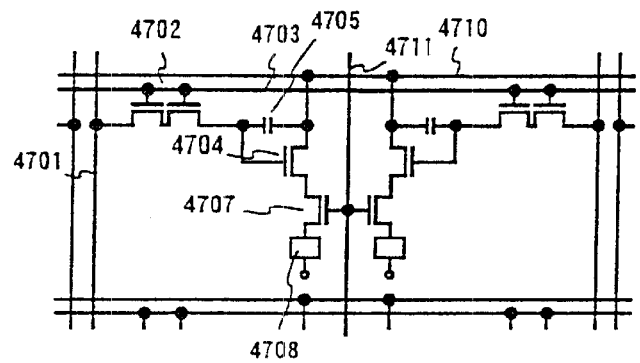

In embodiment 20, examples of the pixel structure of the EL display device shown in Embodiment 17 or Embodiment 18 are shown in FIGS. 23A and 23B. Note that in embodiment 20, reference numeral 4701 denotes a source wiring of a switching TFT 4702, reference numeral 4703 denotes a gate wiring of the switching TFT 4702, reference numeral 4704 denotes a current control TFT, reference numeral 4705 denotes a capacitor (it is possible to omit the capacitor), reference numeral 4706 denotes an electric current supply line, 4707 denotes a power supply control TFT, reference numeral 4709 denotes a power supply control gate wiring, and reference numeral 4708 denotes an EL element. Japanese Patent Application No. Hei 11-341272 may be referred to regarding the operation of the power supply control Further, the power supply control TFT 4707 is formed between the current control TFT 4704 and the EL element 4708 in embodiment 20, but a structure in which the current control TFT 4704 is formed between the power supply TFT 4707 and the EL element 4708 may also be used. Furthermore, it is preferable to either make the power supply control TFT 4707 with the same structure as the current control TFT 4704, or to form then in series on the same active layer.

FIG. 23A is an example of a case in which the electric current supply line 4706 is common between two pixels. Namely, this is,characterized in that the two pixels are formed having linear symmetry around the electric current supply line 4706. In this case, the number of electric current supply lines can be reduced, and therefore the pixel section can be made even more high definition.

In addition, FIG. 23B is an example of a case in which an electric current supply line 4710 is formed parallel to the gate wiring 4703, and in which a power supply control gate wiring 4711 is formed parallel to the source wiring 4701. Note that in FIG. 23B, the structure is formed such that the electric current supply line 4710 and the gate wiring 4703 do not overlap, but provided that both are wirings formed on different layers, then they can be formed to overlap through an insulating film. In this case, the exclusive surface area of the electric current supply line 4710 and the gate wiring 4703 can be shared, and the pixel section can be made even more high definition.

Embodiment 21

Figure 24A:
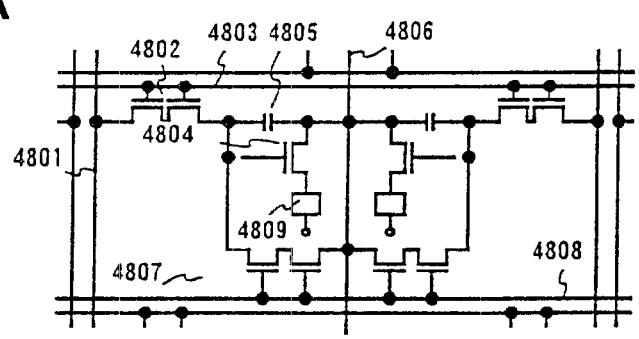
FIGS. 24A and 24B are diagrams showing the circuit structure of an EL display device.
Figure 24B:
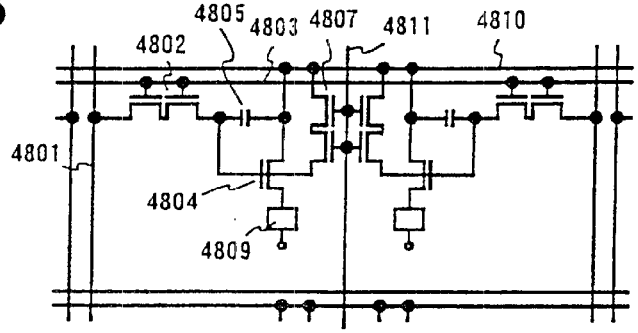

In embodiment 21, examples of the pixel structure of the EL display device shown in Embodiment 17 or Embodiment 18 are shown in FIGS. 24A and 24B. Note that in Embodiment 21, reference numeral 4801 denotes a source wiring of a switching TFT 4802, reference numeral 4803 denotes a gate wiring of the switching TFT 4802, reference numeral 4804 denotes a current control TFT, 4805 denotes a capacitor (it is possible to omit the capacitor), 4806 denotes an electric current supply line, 4807 denotes an erasure TFT, 4808 denotes an erasure gate wiring, and 4809 denotes an EL element. Japanese Patent Application Laid-open No. Hei 11-338786 may be referred to regarding the operation of the erasure TFT 4807.

The drain of the erasure TFT 4807 is connected to a gate of the current control TFT 4804, and it becomes possible to forcibly change the gate voltage of the current control TFT 4804. Note that the erasure TFT 4807 may be used for an n-channel TFT or a p-channel TFT, but it preferably has the same structure as the switching TFT 4802 so that the off current can be made smaller.

FIG. 24A is an example of a case in which the electric current supply line 4806 is common between two pixels. Namely, this is characterized in that the two pixels are formed having linear symmetry around the electric current supply line 4806. In this case, the number of electric current supply lines can be reduced, and therefore the pixel section can be made even more high definition.

In addition, FIG. 24B is an example of a case in which an electric current supply line 4810 is formed parallel to the gate wiring 4803, and in which an erasure gate wiring 4811 is formed parallel to the source wiring 4801. Note that in FIG. 24B, the structure is formed such that the electric current supply line 4810 and the gate wiring 4803 do not overlap, but provided that both are wirings formed on different layers, then they can be formed to overlap through an insulating film. In this case, the exclusive surface area of the electric current supply line 4810 and the gate wiring 4803 can be shared, and the pixel section can be made even more high definition.

Embodiment 22

The EL display device according to the present invention may have a structure in which a pixel may include any numbers of TFTs formed therein. Embodiments 20 and 21 each show an example in which three TFTs are formed in the pixel. However, four to six TFTs may be formed therein. The present invention may be embodied without being limited to the structure of the EL display device Embodiment 23

The electro-optical device and the semiconductor circuit according to the present invention can be used for a display section or a signal processing circuit of electric equipment. As such electric equipment, there are enumerated: video cameras; digital cameras; projectors; projection televisions; goggle type displays (head mount displays) navigation systems; acoustic reproduction devices; acoustic reproduction devices; note-type personal computers; game equipments; portable information terminals (such as mobile computers; portable telephones; portable-type game equipment and electronic books); and image reproduction devices having a recording medium. Specific examples thereof are shown in FIGS. 25A to 27B.

Figure 25A:
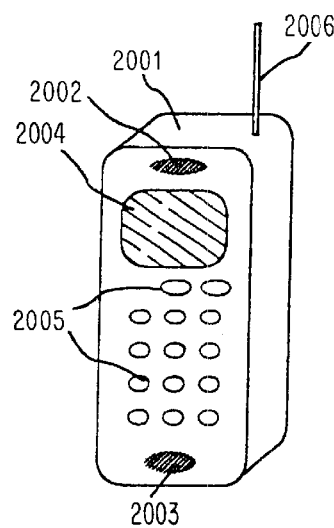
FIGS. 25A to 25F are diagrams showing examples of electronic equipment.

FIG. 25A is a portable telephone, and is composed of a main body 2001, a sound output section 2002, a sound input section 2003, a display section 2004, operation switches 2005, and an antenna 2006. The electro-optical devices of the present invention can be applied to the display section 2004, and the semiconductor circuit of the present invention can be applied to the sound output section 2002, the sound input section 2003, CPU, memories, or the like.

Figure 25B:
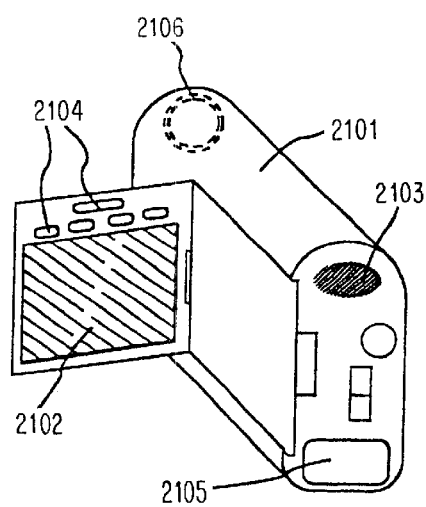

FIG. 25B is a video camera, and is composed of a main body 2101, a display section 2102, a sound input section 2103, operation switches 2104, a battery 2105, and an image receiving section 2106. The electro-optical devices of the present invention can be applied to the display section 2102, and the semiconductor circuit of the present invention can be applied to the sound input section 2103, CPU, memories, or the like.

Figure 25C:
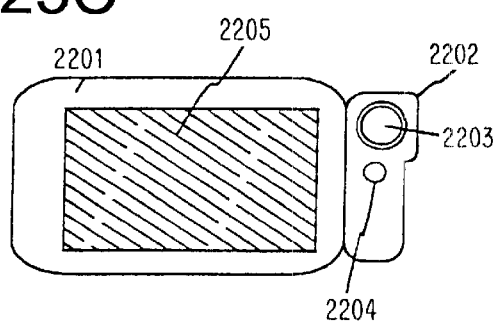

FIG. 25C is a mobile computer, and is composed of a main body 2201, a camera section 2202, an image receiving section 2203, operation switches 2204, and a display section 2205. The electro-optical devices of the present invention can be applied to the display section 2205, and the semiconductor circuit of the present invention can be applied to CPU, memories, or the like.

Figure 25D:
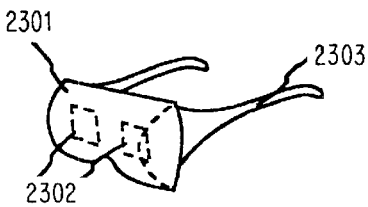

FIG. 25D is a goggle type display, and is composed of a main body 2301, a display section 2302, and an arm section 2303. The electro-optical devices of the present invention can be applied to the display section 2302, and the semiconductor circuit of the present invention can be applied to CPU, memories, or the like.

Figure 25E:
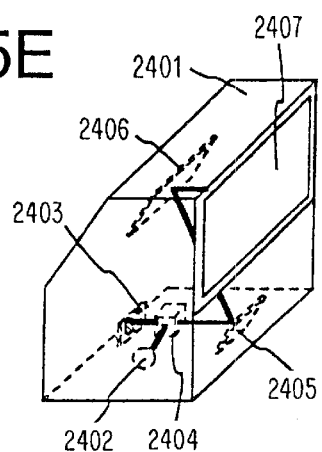

FIG. 25E is a rear type projector (projection television), and is composed of a main body 2401, a light source 2402, a liquid display device 2403, polarizing beam splitter 2404, reflectors 2405 and 2406, and a screen 2707. The present invention can be applied to the liquid display device, and the semiconductor circuit of the present invention can be applied to CPU, memories, or the like.

Figure 25F:
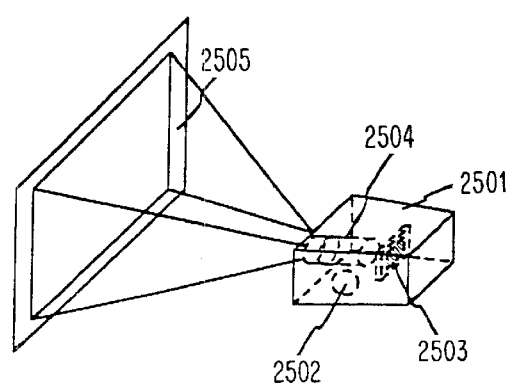

FIG. 25F is a front type projector, and is composed of a main body 2501, a light source 2502, a liquid crystal display device 2503, an optical system 2504 and a screen 2505. The present invention can be applied to the liquid crystal display device 2503, and the semiconductor circuit of the present invention can be applied to CPU, memories, or the like.

Figure 26A:
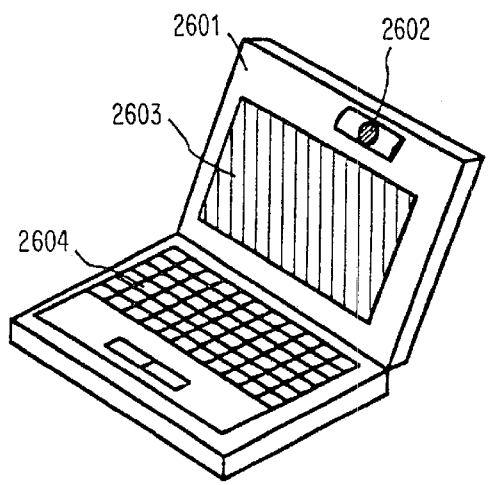
FIGS. 26A to 26D are diagrams showing examples of electronic equipment.

FIG. 26A is a personal computer, and is composed of a main body 2601, an image input section 2602, a display section 2603, a keyboard 2604, etc. The electro-optical device of the present invention can be applied to the display section 2603, and the semiconductor circuit of the present invention can be applied to CPU, memories, or the like.

Figure 26B:
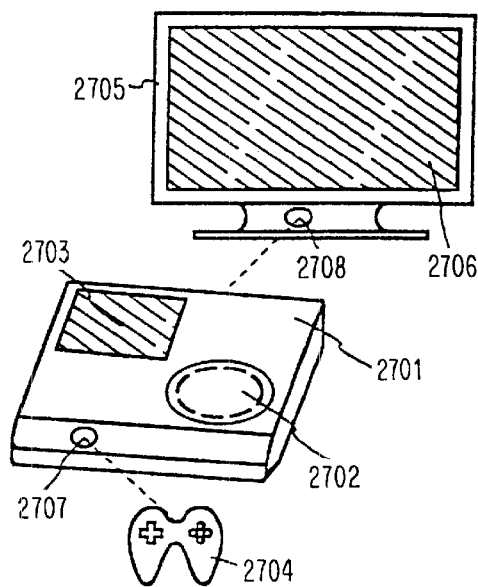

FIG. 26B is an electronic game equipment (a game equipment) including a main body 2701, a recording medium 2702, a display section 2703, and a controller 2704. The voice and the image outputted from the electronic game equipment are reproduced in the display having a body 2705 and a display section 2706. As communication means between the controller 2704 and the main body 2701 or the electronic game equipment and the display, wired communication, wireless communication or optical communication may be used. In this embodiment, there is employed such a structure that an infrared radiation is detected with sensor portions 2707 and 2708. The electro-optical device of the present invention can be applied to the display sections 2703 and 2706, and the semiconductor circuit of the present invention can be applied to CPU, memories, or the like.

Figure 26C:
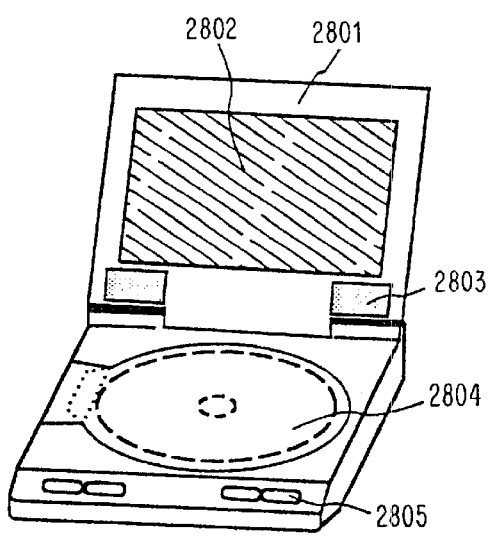

FIG. 26C is a player (image reproduction device) which uses a recording medium on which a program is recorded (hereafter referred to simply as a recording medium), and is composed of a main body 2801, a display section 2802, a speaker section 2803, a recording medium 2804 and operation switches 2805. Note that a DVD (digital versatile disk), CD, or the like is used as a recording medium for this device, and that music appreciation, film appreciation, games, and the Internet can be carried out therewith. The present invention can be applied to display section 2802, CPU, memories or the like.

Figure 26D:
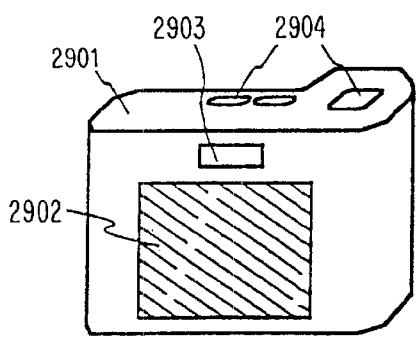

FIG. 26D is a digital camera, and is composed of a main body 2901, a display section 2902, an eyepiece section 2903, operation switches 2904, and an image receiving section (not shown). The electro-optical equipment according to the present invention can be applied to the display section 2902, CPU, memories or the like.

Figure 27A:
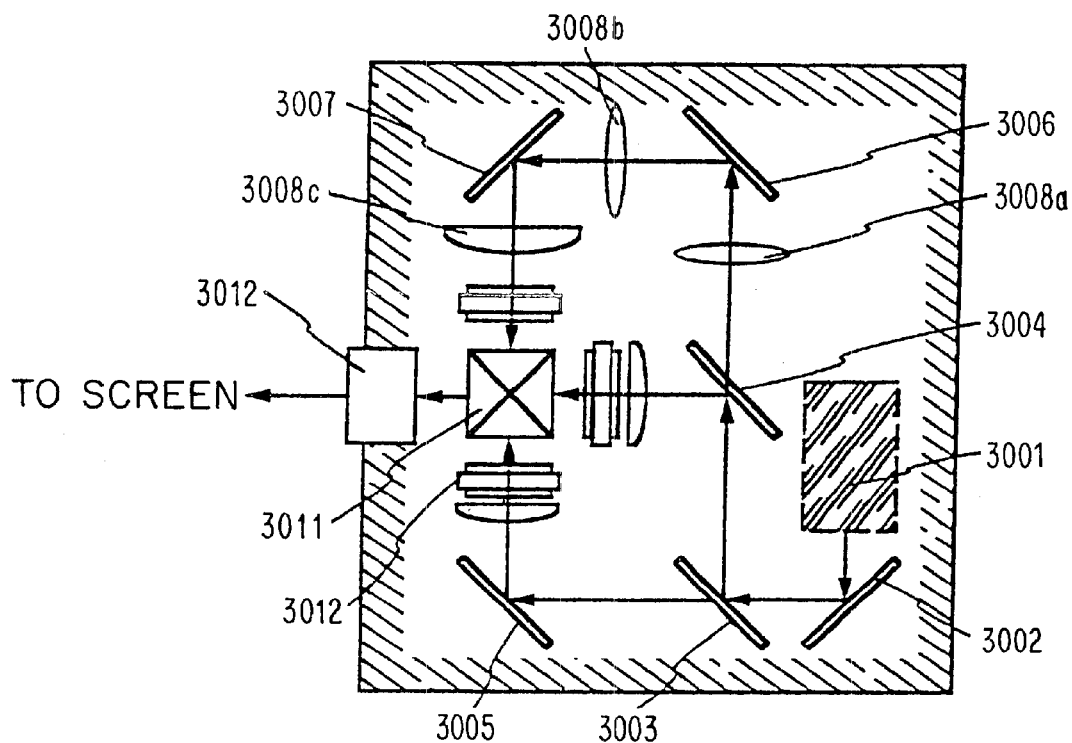
FIGS. 27A and 27B are diagrams showing the structure of an optical engine.
Figure 27B:
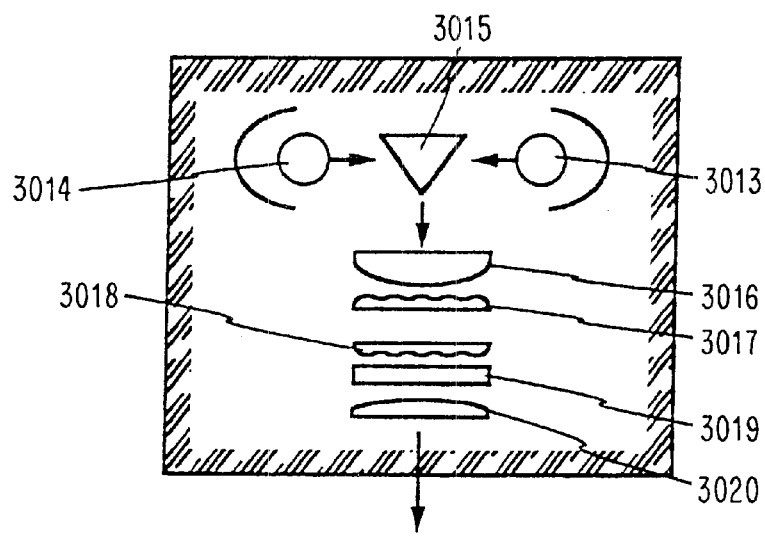

The detailed description of an optical engine that is applicable to the rear-type projector of FIG. 25E and the front-type projector of FIG. 25F is shown in FIG. 27A and 27B. FIG. 27A is an optical engine and FIG. 27B is an optical light source system incorporated to the optical engine.

The optical engine shown in FIG. 27A consists of an optical light source system 3001, mirrors 3002 and 3005 to 3007, dichroic mirrors 3003 and 3004, optical lenses 3008a to 3008c, a prism 3011, a liquid crystal display section 3010, and an optical projection system 3012. The optical projection system 3012 is composed of an optical system provided with a projection lens. This embodiment shows an example of a three plate type in which three liquid crystal display section 3010 is used, but a single plate type may be employed in place thereof. Further, in the optical path indicated by an arrow in FIG. 27A, there may be provided an optical lens, a film having a polarization function, a film to regulate the phase difference, IR films, etc.

As shown in FIG. 27B, the optical light source system 3001 includes light sources 3013 and 3014, a compound prism 3015, collimator lenses 3016 and 3020, lens arrays 3017 and 3018, and a polarizing conversion element 3019. Note that the optical light source system shown in FIG. 27B uses two light sources, but a single light source is acceptable. Three or more light sources may be used. Further, in some place of the light path of the optical light source system, optical lenses, a film having polarization function, a film to regulate the phase difference, IR films, etc., may be provided.

As described above, an applicable range of the present invention is extremely wide, and hence it can be applied to electronic equipment in any fields. Further, the manufacture of the electronic equipment of this embodiment can be realized by using a structure in combination with any of embodiments 1 to 22.

By using the present invention, it becomes possible to arrange on the same substrate TFTs having the appropriate performance in response to the specification required by circuits and element, and the operational performance and the reliability of an electro-optical device can be greatly increased.

Further, in addition to a pixel section and a driver circuit section, a memory section can be formed on the same substrate, and therefore the performance of the electro-optical device can be greatly increased. In addition, it is possible to realize a great expansion in the uses of electronic equipment having the above electro-optical device as a display (display section), and high performance operation and high reliability can also be realized.

What is claimed is:

1. A display device comprising:

a substrate;

a current control p-channel thin film transistor provided over said substrate; and an electroluminescence layer provided over said current control p-channel thin film transistor, wherein a channel region of said current control p-channel thin film transistor is provided in a semiconductor film comprising silicon, and said semiconductor film has a {110} plane.

2. A device according to claim 1 wherein said electroluminescence layer comprises an organic EL material.

3. A device according to claim 1 wherein said electroluminescence layer comprises an inorganic EL material.

4. A device according to claim 1 further comprising a switching thin film transistor provided over said substrate wherein one of a source region and a drain region of said switching thin film transistor is connected with a gate electrode of said current control p-channel thin film transistor.

5. A device according to claim 4 wherein said switching thin film transistor has an n channel type.

6. A device according to claim 1 wherein said display device is incorporated into one selected from the group consisting of portable telephone, video camera, mobile computer, goggle type display, rear type projector, front type projector, personal computer, electronic game equipment, an image reproduction device, and digital camera.

7. A display device comprising:

a substrate;

a channel region provided over said substrate;

a p-type source and a p-type drain provided over said substrate and sandwiching said channel region;

a gate electrode provided adjacent to said channel region with a gate insulating film therebetween;

an anode provided over said substrate and connected with one of said p-type source region and said p-type drain region; and an electroluminescence layer provided over said anode, wherein said channel region is provided in a semiconductor film comprising silicon, and said semiconductor film has a {110} plane.

8. A device according to claim 7 wherein said electroluminescence layer comprises an organic EL material.

9. A device according to claim 7 wherein said electroluminescence layer comprises an inorganic EL material.

10. A device according to claim 7 further comprising a switching thin film transistor provided over said substrate wherein one of a source region and a drain region of said switching thin film transistor is connected with said gate electrode.

11. A device according to claim 10 wherein said switching thin film transistor has an n channel type.

12. A device according to claim 7 wherein said display device is incorporated into one selected from the group consisting of portable telephone, video camera, mobile computer, goggle type display, rear type projector, front type projector, personal computer, electronic game equipment, an image reproduction device, and digital camera.

* * * * *